(12) United States Patent
Jobetto

(10) Patent No.: US 8,004,089 B2
(45) Date of Patent: Aug. 23, 2011

(54) SEMICONDUCTOR DEVICE HAVING WIRING LINE AND MANUFACTURING METHOD THEREOF

(75) Inventor: Hiroyasu Jobetto, Hachioji (JP)

(73) Assignee: Casio Computer Co., Ltd., Tokyo (JP)

( * ) Notice: Subject to any disclaimer, the term of this patent is extended or adjusted under 35 U.S.C. 154(b) by 229 days.

(21) Appl. No.: 12/359,449

(22) Filed: Jan. 26, 2009

(65) Prior Publication Data
US 2009/0194885 A1 Aug. 6, 2009

(30) Foreign Application Priority Data

Jan. 31, 2008 (JP) .................................. 2008-020692

(51) Int. Cl.
*H01L 23/522* (2006.01)
(52) U.S. Cl. ......... 257/773; 257/E23.142; 257/E21.585; 257/678; 257/733; 257/796; 257/E23.001; 257/E23.194; 257/680; 257/686; 257/725; 257/790; 438/637
(58) Field of Classification Search .................. 257/773, 257/E23.142, E21.585, 678, 733, 787, 796, 257/E23.001, E23.194; 438/637
See application file for complete search history.

(56) References Cited

U.S. PATENT DOCUMENTS

| | | | |
|---|---|---|---|
| 5,111,278 A | 5/1992 | Eichelberger | |
| 5,353,498 A | 10/1994 | Fillion et al. | |
| 5,527,741 A | 6/1996 | Cole et al. | |
| 5,703,400 A | 12/1997 | Wojnarowski et al. | |
| 5,821,626 A | 10/1998 | Ouchi et al. | |
| 6,154,366 A | 11/2000 | Ma et al. | |
| 6,271,469 B1 | 8/2001 | Ma et al. | |
| 6,590,291 B2 * | 7/2003 | Akagawa | 257/774 |
| 6,696,764 B2 | 2/2004 | Honda | |
| 7,183,639 B2 | 2/2007 | Mihara et al. | |
| 7,358,114 B2 | 4/2008 | Ooi et al. | |
| 7,445,964 B2 | 11/2008 | Mihara et al. | |
| 2002/0182770 A1 | 12/2002 | Chen et al. | |
| 2003/0137057 A1 | 7/2003 | Honda | |

(Continued)

FOREIGN PATENT DOCUMENTS

CN 1723556 A 1/2006

(Continued)

OTHER PUBLICATIONS

Japanese Office Action dated Jan. 12, 2010 and English translation thereof issued in a counterpart Japanese Application No. 2008-020692.

(Continued)

*Primary Examiner* — Wael M Fahmy
*Assistant Examiner* — Marc Armand
(74) *Attorney, Agent, or Firm* — Holtz, Holtz, Goodman & Chick PC

(57) ABSTRACT

On the lower surface of a semiconductor construct having an external connection electrode, there are formed an insulating film having a planar size greater than that of the semiconductor construct, and a metal layer and a mask metal layer having a connection pad portion in which a first opening corresponding to the external connection electrode is formed. A laser beam is applied using the mask metal layer as a mask, and a second opening is thereby formed in a part of the insulating film corresponding to the external connection electrode. Then, a connection conductor is formed to connect a wiring line to the external connection electrode via the second opening of the insulating film.

20 Claims, 33 Drawing Sheets

U.S. PATENT DOCUMENTS

| | | |
|---|---|---|
| 2004/0051169 A1 | 3/2004 | Chen et al. |
| 2004/0245614 A1 | 12/2004 | Jobetto |
| 2007/0138619 A1* | 6/2007 | Shinagawa et al. ........... 257/700 |
| 2009/0194866 A1 | 8/2009 | Jobetto |

FOREIGN PATENT DOCUMENTS

| | | |
|---|---|---|
| CN | 1830081 A | 9/2006 |
| JP | 9-321408 A | 12/1997 |
| JP | 2001-217337 A | 8/2001 |
| JP | 2003-017854 A | 1/2003 |
| JP | 2003-188314 A | 7/2003 |
| JP | 2004-71998 A | 3/2004 |
| JP | 2004-87661 A | 3/2004 |
| KR | 2005-16302 A | 2/2005 |
| WO | WO 2004/064153 A1 | 7/2004 |

OTHER PUBLICATIONS

Chinese Office Action dated Jan. 29, 2010 and English translation thereof in Chinese Application No. 2009100098367, which is a counterpart of related U.S. Appl. No. 12/359,427.

Related U.S. Appl. No. 12/359,427, filed Jan. 26, 2009.

Chinese Office Action dated Feb. 26, 2010 and English translation thereof in counterpart Chinese Application No. 200910009626.8.

* cited by examiner

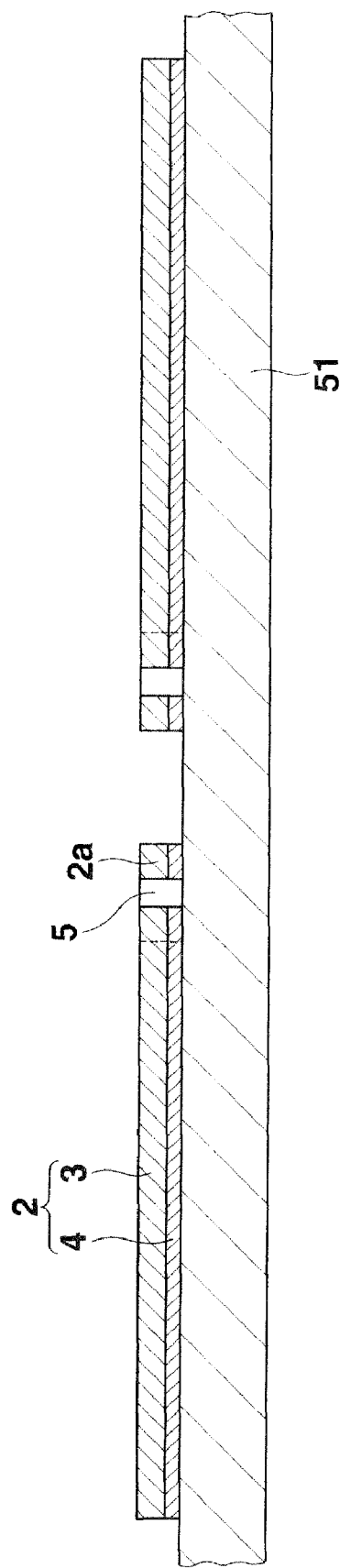
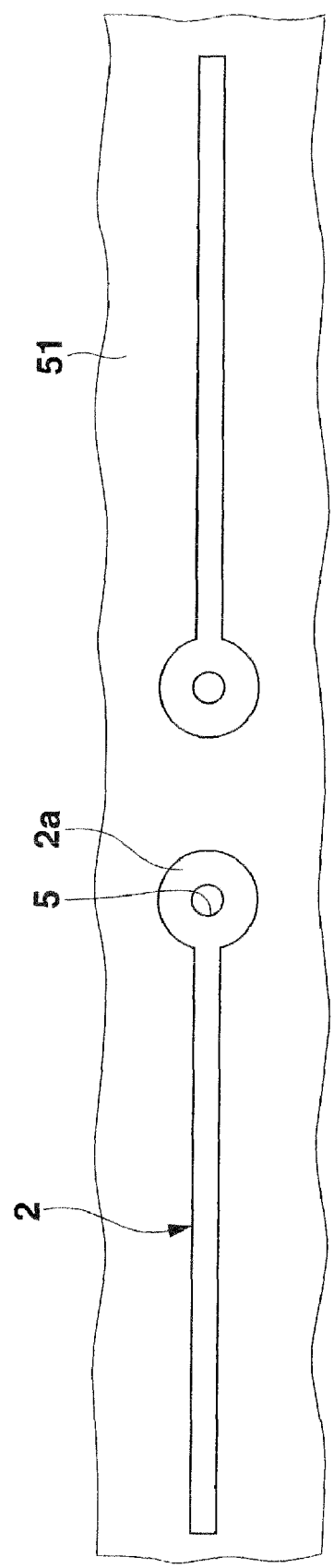

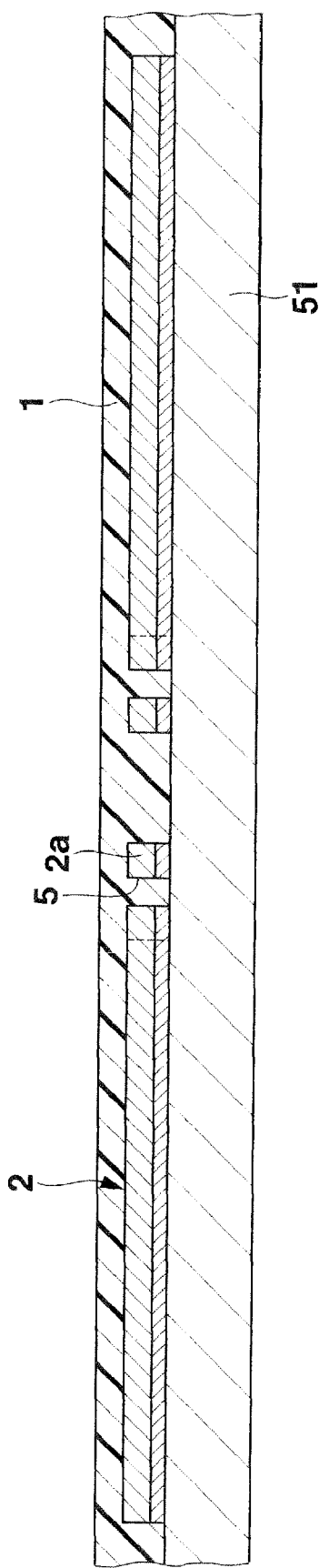

SEMICONDUCTOR DEVICE HAVING WIRING LINE AND MANUFACTURING METHOD THEREOF

CROSS-REFERENCE TO RELATED APPLICATIONS

This application is based upon and claims the benefit of priority from prior Japanese Patent Application No. 2008-020692, filed Jan. 31, 2008, the entire contents of which are incorporated herein by reference.

BACKGROUND OF THE INVENTION

1. Field of the Invention

This invention relates to a semiconductor device having a wiring line and a manufacturing method thereof.

2. Description of the Related Art

In a method employed to increase the packaging density of a semiconductor device, a semiconductor construct called a chip size package (CSP) is provided on a base plate having a planar size greater than that of the semiconductor construct. Jpn. Pat. Appln. KOKAI Publication No. 2004-71998 discloses the structure of such a semiconductor device and a manufacturing method thereof. In the semiconductor device disclosed in this prior literature, an insulating layer is provided on the base plate around the semiconductor construct. An upper insulating film is provided on the semiconductor construct and the insulating layer. An upper wiring line is provided on the upper insulating film so that this upper wiring line is connected to an external connection electrode (columnar electrode) of the semiconductor construct.

In the meantime, in the conventional semiconductor device manufacturing method described above, it is necessary to form an opening in a part of the upper insulating film corresponding to the center of the upper surface of the columnar electrode of the semiconductor construct in order to connect the upper wiring line formed on the upper insulating film to the columnar electrode of the semiconductor construct. In this case, it is known to form the opening in the upper insulating film by laser processing based on laser beam irradiation.

On the other hand, if the diameter of the laser beam is about 50 μm which is the minimum diameter at present, the diameter of the opening to be formed in the upper insulating film is about 70 μm. In this case, when the accuracy of the laser processing is taken into account, the diameter of the columnar electrode of the semiconductor construct needs to be 100 to 120 μm. Therefore, the problem is that there is a limit to the miniaturization of the semiconductor construct and it is impossible to adapt to an increase in the number of columnar electrodes.

BRIEF SUMMARY OF THE INVENTION

It is therefore an object of this invention to provide a semiconductor device and a manufacturing method thereof that enable further miniaturization.

According to the invention, there is provided a semiconductor device comprising:

a semiconductor construct having a semiconductor substrate and an external connection electrode provided on the semiconductor substrate;

a wiring line having a connection pad portion in which a first opening is formed to correspond to the external connection electrode of the semiconductor construct;

an insulating film which is provided between the external connection electrode and the connection pad portion and which has a second opening communicating with the first opening and reaching the external connection electrode;

a connection conductor which electrically connects the external connection electrode to the wiring line via the first opening and the second opening; and a mask metal layer formed between the connection conductor and the wiring line.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 3A is a sectional view of a step following FIG. 2, and FIG. 3B is a plan view thereof;

FIG. 4 is a sectional view of a step following FIG. 3;

DETAILED DESCRIPTION OF THE INVENTION

First Embodiment

Figure 1:
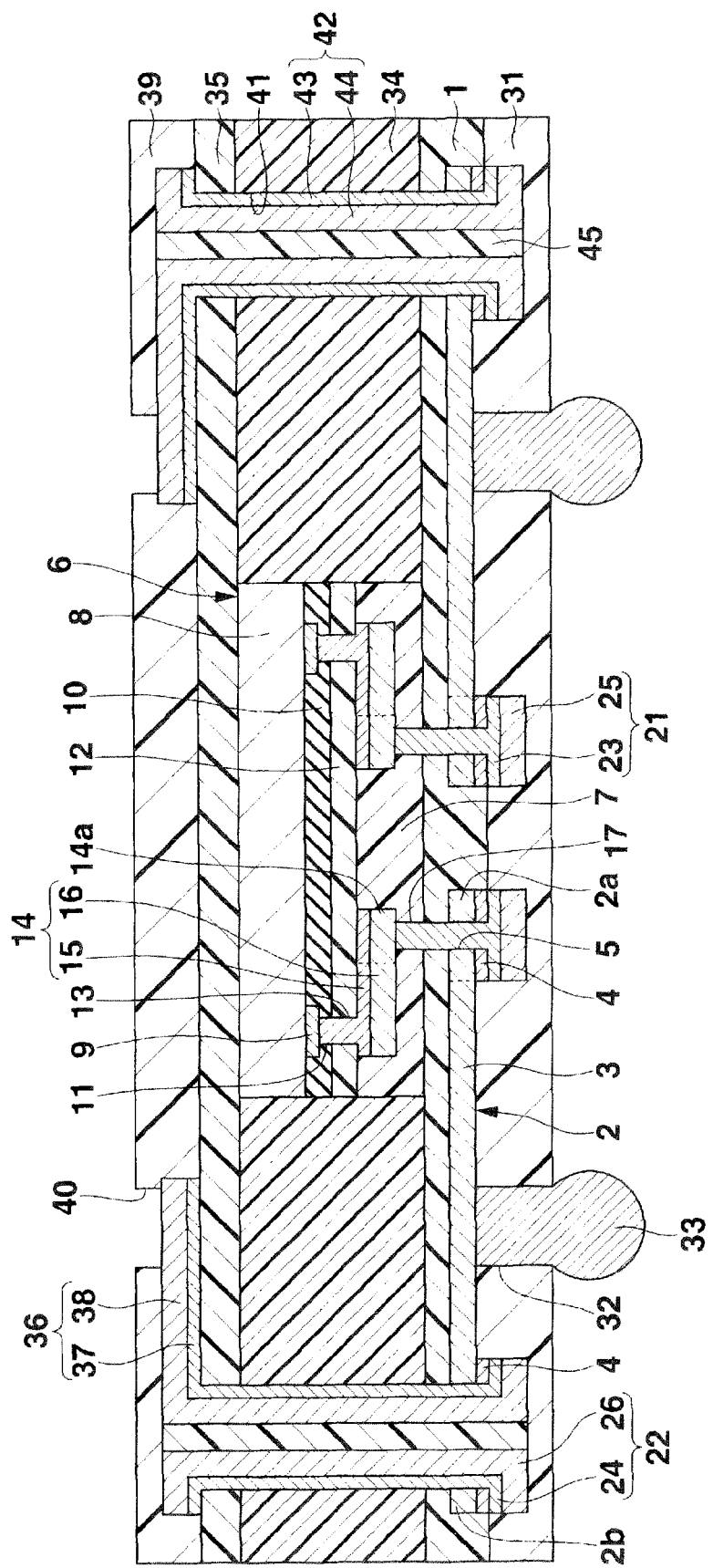
FIG. 1 is a sectional view of a semiconductor device as a first embodiment of this invention.

FIG. 1 shows a sectional view of a semiconductor device as a first embodiment of this invention. This semiconductor device comprises a planar square lower insulating film 1 made of, for example, an epoxy resin, a polyimide resin, or an epoxy resin having a glass cloth base material. A lower wiring line (laminated wiring line) 2 is embedded in the lower side of the lower insulating film 1. The lower wiring line 2 has a structure in which a foundation metal layer 4 made of nickel is provided on the lower surfaces of both ends of an upper metal layer 3 made of copper. At both ends of the double-layer structure of the lower wiring line 2, there are a connection pad portion 2a located in the center of the lower surface of the lower insulating film (insulating film) 1, and a connection pad portion 2b located in the peripheral part of the lower surface of the lower insulating film 1.

The lower surface of the foundation metal layer (mask metal layer) 4 of the connection pad portions 2a, 2b of the lower wiring line 2 is flush with the lower surface of the lower insulating film 1. Thus, the lower surface of a part of the lower wiring line 2 only consisting of the upper metal layer (wiring line) 3 in a region other than the connection pad portions 2a, 2b is positioned higher for the thickness of the foundation metal layer 4 than the lower surface of the lower insulating film 1. The connection pad portion 2a of the lower wiring line 2 is in the shape of a ring having an opening 5 of a circular planar shape (see FIG. 3B).

A semiconductor construct 6 is installed in the center of the upper surface of the lower insulating film 1 via an adhesive layer (insulating film) 7 made of, for example, an epoxy resin. The semiconductor construct 6 comprises a planar square silicon substrate (semiconductor substrate) 8. An integrated circuit (not shown) having a predetermined function is provided on the lower surface of the silicon substrate 8. In the peripheral parts of this lower surface, a plurality of connection pads 9 made of, for example, an aluminum-based metal and connected to the integrated circuit are provided along the sides of the silicon substrate. An insulating film 10 made of, for example, silicon oxide is provided on the lower surface of the silicon substrate 8 except for the centers of the connection pads 9, and the centers of the connection pads 9 are exposed via openings 11 provided in the insulating film 10.

A protective film 12 made of, for example, a polyimide resin is provided on the lower surface of the insulating film 10. Openings 13 are provided in parts of the protective film 12 corresponding to the openings 11 of the insulating film 10. Wiring lines 14 are provided on the lower surface of the protective film 12. The wiring line 14 has a double-layer structure composed of a foundation metal layer 15 made of nickel and provided on the lower surface of the protective film 12, and an upper metal layer 16 made of copper and provided on the lower surface of the foundation metal layer 15. One end of the wiring line 14 is connected to the connection pad 9 via the openings 11, 13 in the insulating film 10 and the protective film 12. Although two wiring lines 14 are only shown in the drawing, the number of wiring lines 14 actually provided corresponds to the connection pads 9 arranged along the respective sides of the planar square silicon substrate 8. Other ends of the wiring lines 14 which are referred to as connection pad portions 14a described later are arranged in matrix form under the insulating film 12.

Furthermore, the lower surface of the protective film 12 including the wiring lines 14 of the semiconductor construct 6 is adhesively bonded to the center of the upper surface of the lower insulating film 1 via the adhesive layer 7 made of, for example, an epoxy resin, such that the semiconductor construct 6 is installed in the center of the upper surface of the lower insulating film 1. Openings (second openings) 17 having a circular planar shape are provided in the parts of the lower insulating film 1 and the adhesive layer 7 corresponding to the centers of the lower surfaces of the connection pad portions (external connection electrodes) 14a of the wiring lines 14 of the semiconductor construct 6. The opening 17 is in communication with the opening 5 of the connection pad portion 2a of the lower wiring line 2.

First and second connection pad portions 21, 22 are provided on the lower surfaces of the connection pad portions 2a, 2b of the lower wiring line 2. The first and second connection pad portions 21, 22 have double-layer structures composed of foundation metal layers 23, 24 made of nickel and provided on the lower surfaces of the connection pad portions 2a, 2b of the lower wiring line 2, and upper metal layers 25, 26 made of copper and provided on the lower surfaces of the foundation metal layers 23, 24.

The first connection pad portion (connection conductor) 21 is connected to the connection pad portion 14a of the wiring line 14 of the semiconductor construct 6 via the opening (first opening) 5 of the connection pad portion 2a of the lower wiring line 2 and via the opening 17 in the lower insulating film 1 and the adhesive layer 7. In other words, the first connection pad portion 21 connects the connection pad portion 2a of the lower wiring line 2 to the connection pad portion 14a of the wiring line 14 of the semiconductor construct 6.

A lower overcoat film 31 made of, for example, a solder resist is provided on the lower surfaces of the lower wiring line 2, the first and second connection pad portions 21, 22 and the lower insulating film 1. An opening 32 is provided in a part of the lower overcoat film 31 corresponding to the connection pad portion of the lower wiring line 2 only consisting of the upper metal layer 3. A solder ball 33 is provided in and under the opening 32 of the lower overcoat film 31 so that this solder ball is connected to the connection pad portion of the lower wiring line 2 only consisting of the upper metal layer 3.

An insulating layer 34 is provided on the upper surface of the lower insulating film 1 around the adhesive layer 7 and the semiconductor construct 6. The insulating layer 34 is made of, for example, an epoxy resin, a polyimide resin, or an epoxy resin having a glass cloth base material. An upper insulating film 35 made of the same material as the lower insulating film 1 is provided on the upper surfaces of the semiconductor construct 6 and the insulating layer 34.

An upper wiring line 36 is provided on the upper surface of the upper insulating film 35. The upper wiring line 36 has a double-layer structure composed of a foundation metal layer 37 made of nickel and provided on the upper surface of the upper insulating film 35, and an upper metal layer 38 made of copper and provided on the upper surface of the foundation metal layer 37. An upper overcoat film 39 made of, for example, a solder resist is provided on the upper surfaces of the upper wiring line 36 and the upper insulating film 35. An opening 40 is provided in a part of the upper overcoat film 39 corresponding to the connection pad portion of the upper wiring line 36.

The connection pad portion 2b of the lower wiring line 2 and the upper wiring line 36 are connected to each other via a vertical conducting portion 42 provided in the inner wall surface of a through-hole 41 which is provided in the center of the connection pad portion 2b of the lower wiring line 2 and in parts of the lower insulating film 1, the insulating layer 34 and the upper insulating film 35 that correspond to the center of the connection pad portion 2b. The vertical conducting portion 42 has a double-layer structure composed of a foundation metal layer 43 made of nickel and provided on the inner wall surface of the through-hole 41, and an upper metal layer 44 made of copper and provided on the inner surface of the foundation metal layer 43. A filling material 45 made of, for example, a solder resist is filled in the vertical conducting portion 42. Here, the second connection pad portion 22 is provided continuously from the lower part of the vertical conducting portion 42.

Figure 2:
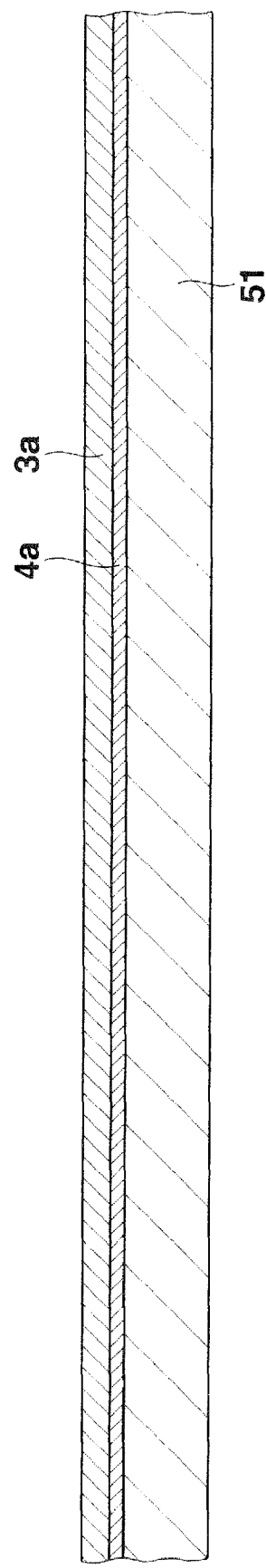
FIG. 2 is a view for explaining one example of a manufacturing method in the first embodiment of this invention.

Next, one example of a method of manufacturing this semiconductor device is described. First, as shown in FIG. 2, a unit is prepared wherein a lower wiring line foundation metal layer forming layer 4a made of electroless nickel plating and a lower wiring line upper metal layer forming layer 3a made of electrolyte copper plating are formed on the upper surface of a base plate 51 made of copper foil. In this case, this prepared unit is sized so that a plurality of completed semiconductor devices shown in FIG. 1 can be formed.

Then, the lower wiring line upper metal layer forming layer 3a and the lower wiring line foundation metal layer forming layer 4a are patterned by the photolithographic method, the lower wiring line (laminated wiring line) 2 having the double-layer structure composed of the foundation metal layer 4 and the upper metal layer 3 is formed on the lower surface of the base plate 51, as shown in FIG. 3A and FIG. 3B which is a plan view of FIG. 3A. In this state, the opening 5 is formed in the center of the connection pad portion 2a of the lower wiring line 2.

In addition, the lower wiring line 2 may be formed in the following manner: First, a unit is prepared wherein the lower wiring line foundation metal layer forming layer 4a alone is provided on the lower surface of the base plate 51 in FIG. 2 with no lower wiring line upper metal layer forming layer 3a. Then, a plating resist film is provided on the upper surface of the lower wiring line foundation metal layer forming layer 4a, and the plating resist film is patterned/formed after the region of this plating resist film corresponding to the lower wiring line 2 including the connection pad portion 2a has been removed.

Then, electrolytic plating with copper is carried out using the lower wiring line foundation metal layer forming layer 4a as a plating current path, thereby forming the upper metal layer 3 having the opening 5 on the lower surface of the lower wiring line foundation metal layer forming layer 4a. Further, the plating resist film is released, and the upper metal layer 3 is used as a mask to etch and remove unnecessary portions of the lower wiring line foundation metal layer forming layer 4a, and then the foundation metal layer 4 having the opening 5 is formed on the lower surface of the upper metal layer 3. Thus, the lower wiring line 2 is formed. In addition, such a formation method is hereinafter referred to as a pattern plating method.

Then, an appearance test or a conduction test of the lower wiring line 2 is carried out. In a plurality of semiconductor device forming regions under the base plate 51, when it is found by this test that the lower wiring line 2 is formed as desired in a semiconductor device forming region, such a semiconductor device forming region is judged to be nondefective. When the lower wiring line 2 is not formed as desired in a semiconductor device forming region, such a semiconductor device forming region is judged to be defective.

Accordingly, the semiconductor device forming regions are differentiated: the semiconductor device forming regions judged to be nondefective are designated as nondefective semiconductor device forming regions, while the semiconductor device forming regions judged to be defective are designated as defective semiconductor device forming regions.

Then, as shown in FIG. 4, the lower insulating film 1 made of, for example, an epoxy resin, a polyimide resin, or an epoxy resin having a glass cloth base material is formed on the upper surface of the base plate 51 including the lower wiring line 2. In this state, the lower insulating film 1 is filled in the opening 5 of the connection pad portion 2a of the lower wiring line 2. In addition, if the lower insulating film 1 is transparent, the appearance test of the lower wiring line 2 may be carried out at this point.

Figure 5:
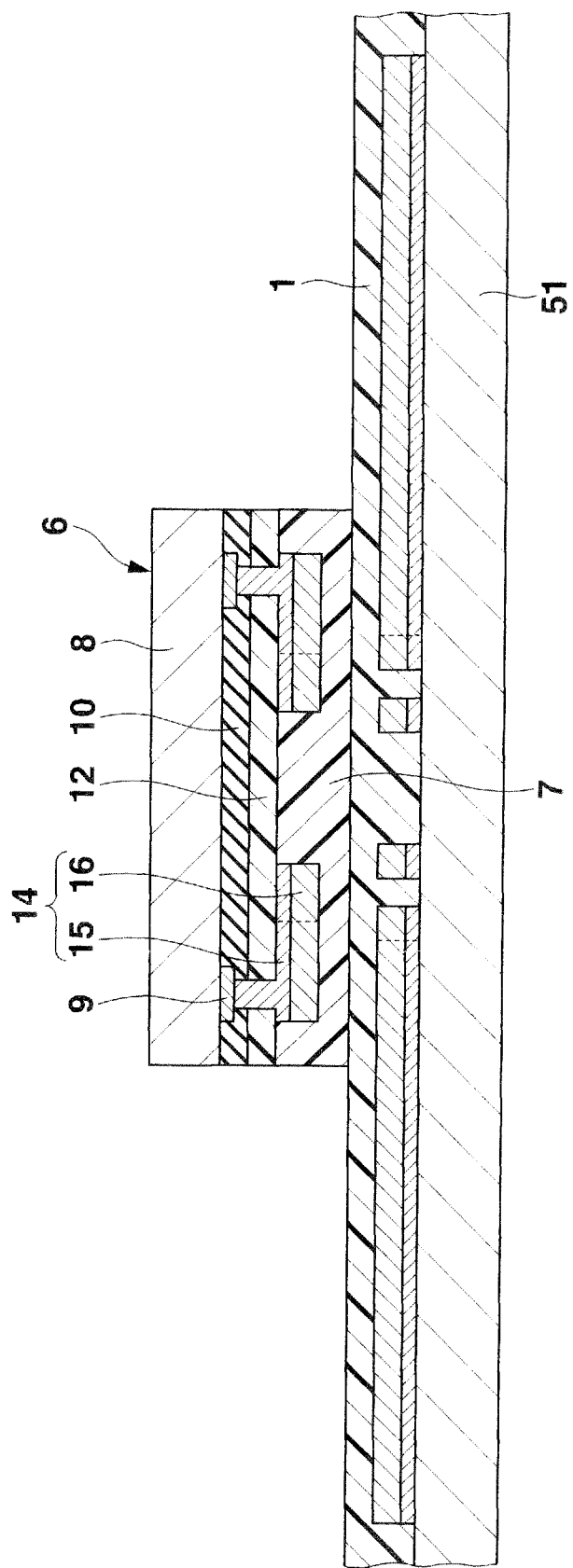
FIG. 5 is a sectional view of a step following FIG. 4.

Then, as shown in FIG. 5, the semiconductor construct 6 is prepared. In order to obtain this semiconductor construct 6, the integrated circuit (not shown), the connection pads 9 made of, for example, an aluminum-based metal, the insulating film 10 made of, for example, silicon oxide, the protective film 12 made of, for example, a polyimide resin and the wiring line 14 (the foundation metal layer 15 made of nickel and the upper metal layer 16 made of copper) are formed under the silicon substrate 8 in a wafer state and then divided into pieces by dicing.

Then, the lower surface of the protective film 12 including the wiring lines 14 of the semiconductor construct 6 is adhesively bonded to a semiconductor construct installation region on the upper surface of the lower insulating film 1 via the adhesive layer 7 made of, for example, an epoxy resin, such that the semiconductor construct 6 is installed thereon. In this case, the semiconductor construct installation region on the upper surface of the lower insulating film 1 is previously supplied with an adhesive called a non-conductive paste (NCP) using, for example, a printing method or a dispenser or supplied with an adhesive sheet called a non-conductive film (NCF), and the semiconductor construct 6 is fixedly connected onto the upper surface of the lower insulating film 1 by hot press bonding.

Here, as described above, the appearance test or the conduction test of the lower wiring line 2 is carried out, and the plurality of semiconductor device forming regions on the upper surface of the lower insulating film 1 are differentiated: the nondefective semiconductor device forming regions and the defective semiconductor device forming regions. Therefore, the semiconductor constructs 6 are only installed on the nondefective semiconductor device forming regions, and the semiconductor constructs 6 are not installed on the defective semiconductor device forming regions.

Figure 6:
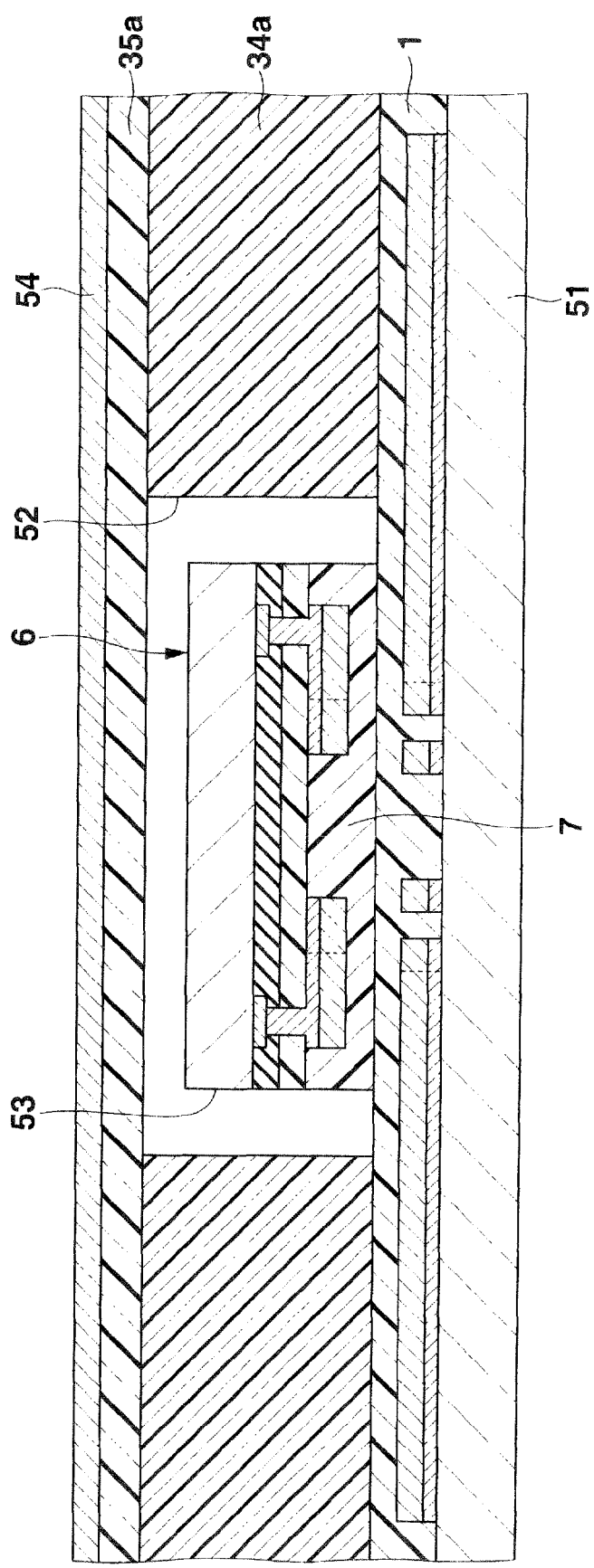
FIG. 6 is a sectional view of a step following FIG. 5.

Then, as shown in FIG. 6, a lattice-shaped insulating film forming sheet 34a is disposed on the upper surface of the lower insulating film 1 around the semiconductor construct 6 including the adhesive layer 7 while being positioned by, for example, pins. The insulating film forming sheet 34a is formed by impregnating a thermosetting resin made of, for example, an epoxy resin into a base material made of, for example, glass cloth, and semi-curing the thermosetting resin into a sheet state in which a plurality of square openings 52 are formed by, for example, punching. The size of the opening 52 of the insulating film forming sheet 34a is slightly larger than the size of the semiconductor construct 6. Thus, a space 53 is formed between the insulating film forming sheet 34a and the semiconductor construct 6.

Then, an upper insulating film forming layer 35a formed on the lower surface of a sub-base plate 54 made of copper foil is disposed on the upper surface of the insulation film forming sheet 34*a*. The upper insulating film forming layer 35*a* is made of the same material as the lower insulating film 1, of which material a thermosetting resin made of, for example, an epoxy resin is semi-cured.

Figure 7:
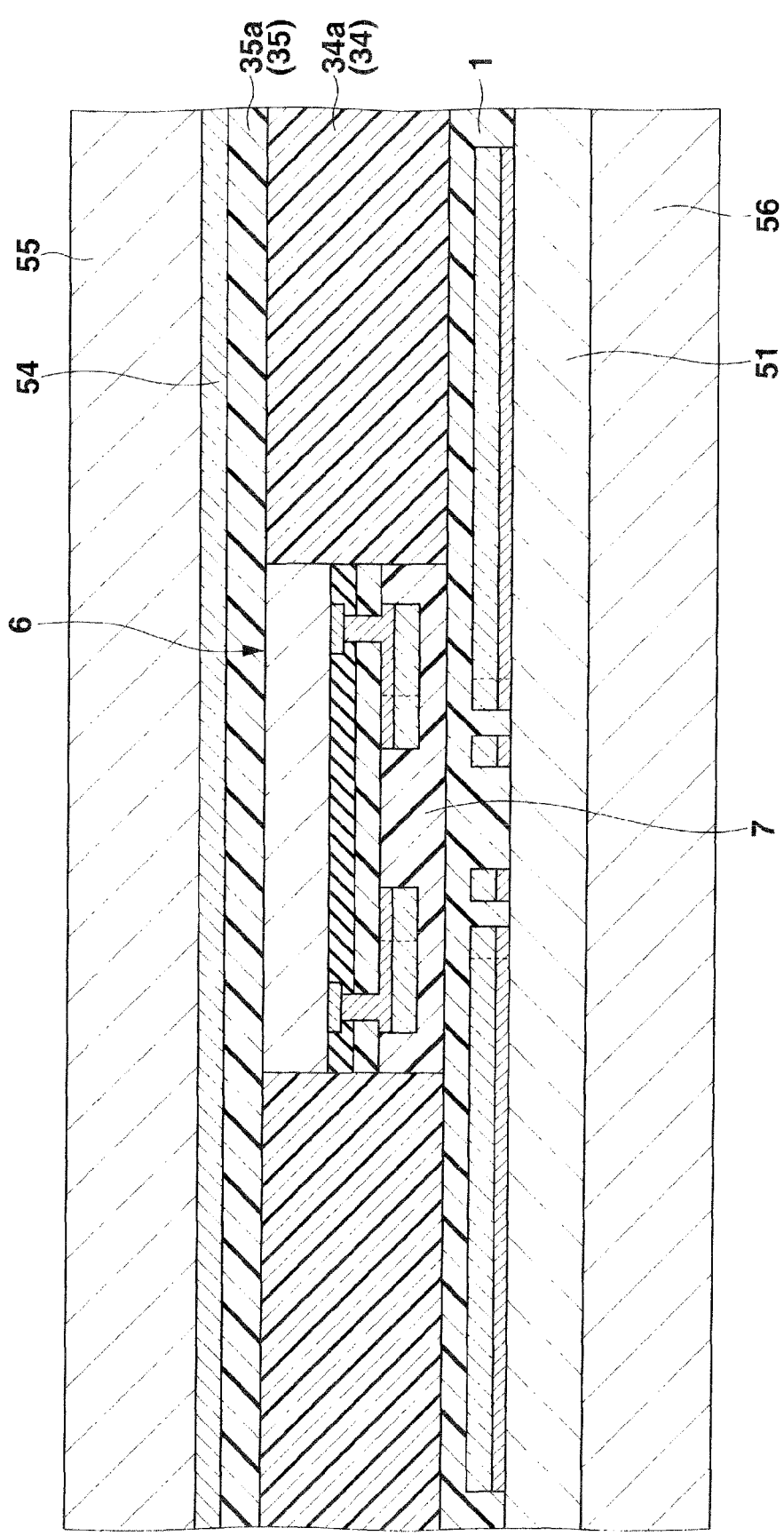
FIG. 7 is a sectional view of a step following FIG. 6.

Then, as shown in FIG. 7, the insulating film forming sheet 34*a* and the upper insulating film forming layer 35*a* are hot-pressed from the top and bottom using a pair of hot-pressing plates 55, 56. The thermosetting resin in the insulating film forming sheet 34*a* and the upper insulating film forming layer 35*a* flows due to the hot-pressing and is thus filled into the space 53 shown in FIG. 6, and is then solidified by subsequent cooling. Thus, the insulating layer 34 is formed on the upper surface of the lower insulating film 1 around the semiconductor construct 6 including the adhesive layer 7, and the upper insulating film 35 is formed on the upper surfaces of the semiconductor construct 6 and the Insulating layer 34.

Here, as shown in FIG. 6, the lower insulating film 1 and the base plate 51 are disposed on the lower surface of the insulating film forming sheet 34*a*, and the upper insulating film forming layer 35*a* made of the same material as the lower insulating film 1 and the sub-base plate 54 made of the same material as the base plate 51 are disposed on the upper surface of the insulating film forming sheet 34*a*, so that the material configuration in the part of the insulating film forming sheet 34*a* in the thickness direction is symmetrical. As a result, the insulating film forming sheet 34*a* and the upper insulating film forming layer 35*a* symmetrically harden and contract in the thickness direction due to the hot-pressing and thus do not easily warp as a whole, thus making it difficult to cause trouble to transport to subsequent steps and to processing accuracy in the subsequent steps.

In this case, the lower insulating film 1 hardly deforms even if hot-pressed because the thermosetting resin thereof has been cured in advance. Moreover, the sub-base plate 54 can prevent the thermosetting resin of the upper insulating film forming layer 35*a* from unnecessarily adhering to the lower surface of the upper hot-pressing plate 55. Consequently, the upper hot-pressing plates 55 can be reused as it is.

Figure 8:
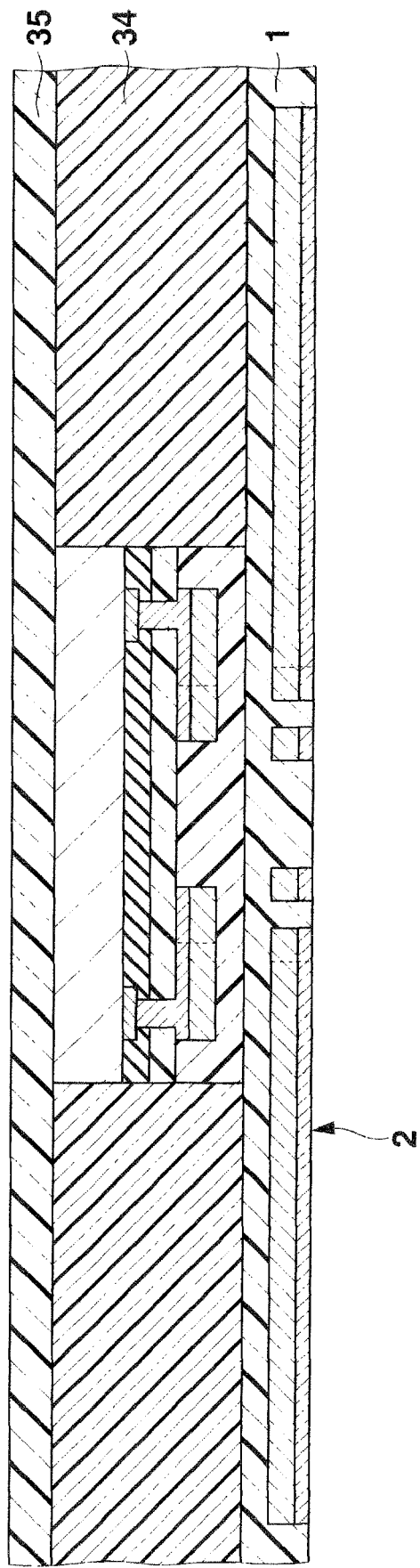
FIG. 8 is a sectional view of a step following FIG. 7.

Then, the base plate 51 and the sub-base plate 54 are removed by etching, such that the lower surface of the lower insulating film 1 including the lower wiring line 2 is exposed, and the upper surface of the upper insulating film 35 is also exposed, as shown in FIG. 8. Thus, in the present embodiment, the base plate 51 and the sub-base plate 54 that are required in the manufacturing process are removed by etching, which is advantageous in that the thickness of a completed semiconductor can be smaller. In this state, the lower surface of the lower wiring line 2 is flush with the lower surface of the lower insulating film 1. Moreover, even if the base plate 51 and the sub-base plate 54 are removed, sufficient strength can be assured owing to the presence of the lower insulating film 1, the insulating layer 34 and the upper insulating film 35.

Figure 9:
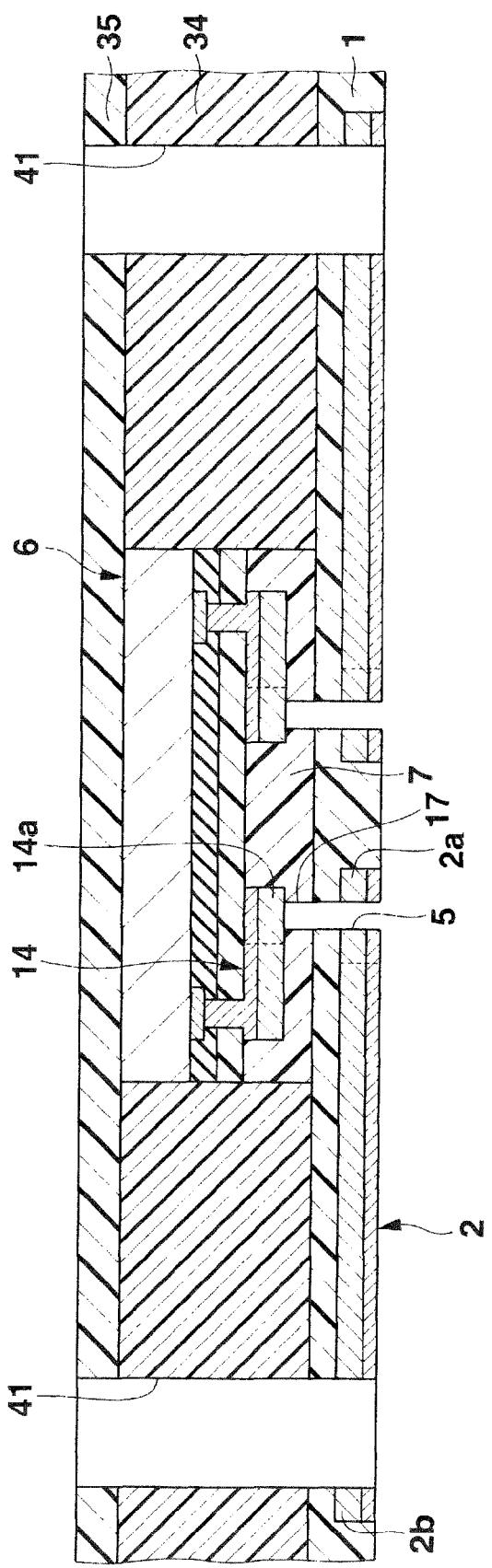
FIG. 9 is a sectional view of a step following FIG. 8.

Then, as shown in FIG. 9, by laser processing based on laser beam irradiation, the lower insulating film 1 in the opening 5 of the connection pad portion 2*a* of the lower wiring line 2 is removed, and the opening 17 is formed in parts of the lower insulating film 1 and the adhesive layer 7 corresponding to the center of the lower surface of the connection pad portion 14*a* of the wiring line 14 of the semiconductor construct 6. Further, the through-hole 41 is formed in the center of the connection pad portion 2*b* of the lower wiring line 2 and in parts of the lower insulating film 1, the insulating layer 34 and the upper insulating film 35 corresponding to the center of the connection pad portion 2*b* by use of a mechanical drill or by laser processing based on laser beam irradiation.

The case where the opening 17 is formed by laser beam irradiation is described. If a laser beam is directly applied to the lower insulating film 1 and the adhesive layer 7, an opening having a diameter corresponding to the diameter of the beam is formed. Here, the diameter of the connection pad portion 14*a* of the wiring line 14 of the semiconductor construct 6 is smaller than the outside diameter of the connection pad portion 2*a* of the lower wiring line 2 and greater than the inside diameter thereof (the diameter of the opening 5). Thus, if the diameter of the laser beam is equal to or more than the diameter of the connection pad portion 14*a* of the wiring line 14 of the semiconductor construct 6 and less than the outside diameter of the connection pad portion 2*a* of the lower wiring line 2, the laser beam applied outside the opening 5 of the connection pad portion 2*a* is blocked by the connection pad portion 2*a*, so that the diameter of the opening 17 formed in the lower insulating film 1 and the adhesive layer 7 corresponds to the diameter of the opening 5 of the connection pad portion 2*a* of the lower wiring line 2.

That is, the connection pad portion 2*a* of the lower wiring line 2 has the opening 5 in its center, such that the connection pad portion 2*a* functions as a mask when the opening 17 is formed in the lower insulating film 1 and the adhesive layer 7 by laser processing based on laser beam irradiation, and the opening 17 having the same diameter as the opening 5 of the connection pad portion 2*a* is formed in the lower insulating film 1 and the adhesive layer 7 in self-alignment with the opening 5 of the connection pad portion 2*a*.

As a result, the diameter of the opening 17 to be formed in the lower insulating film 1 and the adhesive layer 7 can be as small as possible, and it becomes relatively easier to align the connection pad portion 14*a* of the wiring line 14 of the semiconductor construct 6 with the connection pad portion 2*a* of the lower wiring line 2. Thus, the diameter of the connection pad portion 14*a* of the wiring line 14 of the semiconductor construct 6 can be as small as possible, and the semiconductor construct 6 can be miniaturized.

For example, the minimum diameter of the laser beam is about 50 μm in the present situation. If the laser beam is directly applied to the lower insulating film 1 and the adhesive layer 7, the diameter of an opening formed therein is about 70 μm. Therefore, in order to receive all the irradiated laser beam, the diameter of the connection pad portion 14*a* of the wiring line 14 of the semiconductor construct 6 has to be 100 to 120 μm in current methods when the accuracy of laser processing is taken into account.

In contrast, in the method of the present embodiment in which the connection pad portion 2*a* of the lower wiring line 2 serves as a mask for the laser beam, the diameter of the opening 5 of the connection pad portion 2*a* of the lower wiring line 2 formed by the photolithographic method can be 20 to 50 μm, particularly 20 to 30 μm. Thus, the diameter of the connection pad portion 14*a* of the wiring line 14 of the semiconductor construct 6 can be 50 to 80 μm, particularly 50 to 60 μm. Accordingly, the semiconductor construct 6 can be miniaturized. In this case, the outside diameter of the connection pad portion 2*a* of the lower wiring line 2 has to be 100 to 120 μm when the accuracy of laser processing is taken into account.

Figure 10:
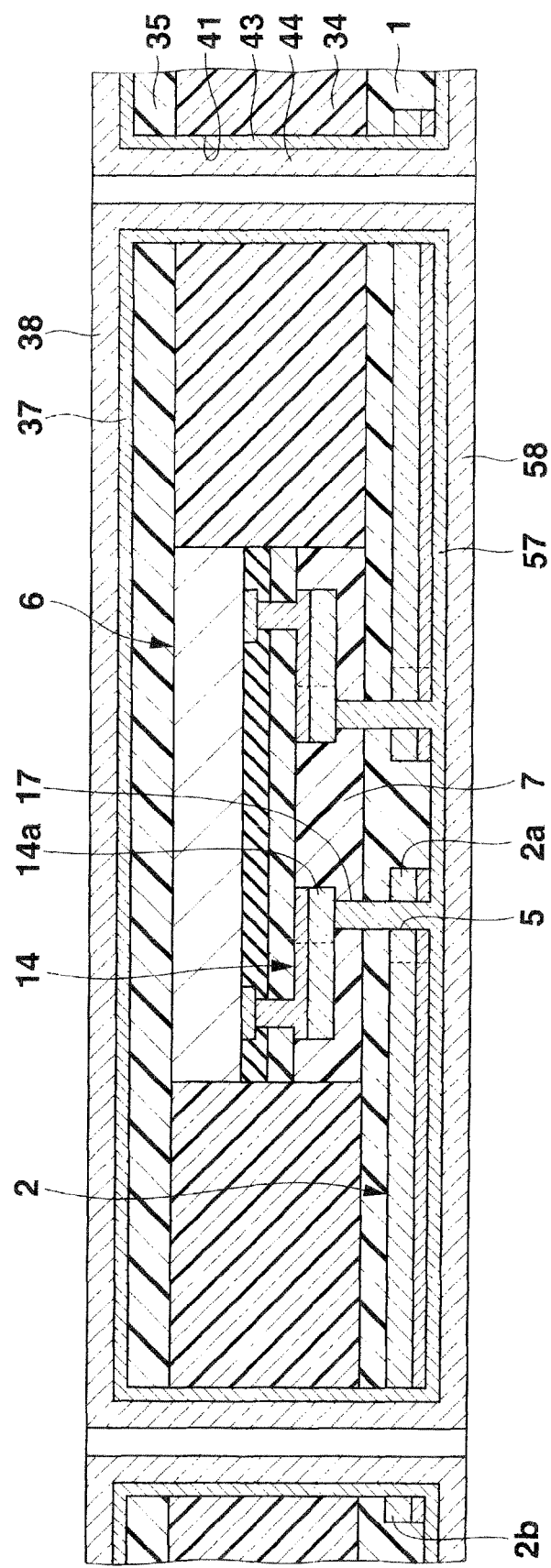
FIG. 10 is a sectional view of a step following FIG. 9.

Then, as shown in FIG. 10, foundation metal layers 57, 37, 43 are formed by electroless plating with nickel on the entire lower surface of the lower insulating film 1 including the lower surface of the connection pad portion 14*a* of the wiring line 14 of the semiconductor construct 6 exposed via the opening 5 of the connection pad portion 2*a* of the lower wiring line 2 and via the opening 17 in the lower insulating film 1 and the adhesive layer 7 and including the lower wiring line 2, on the entire upper surface of the upper insulating film 35, and on the inner wall surface of the through-hole 41. Further, electrolytic plating with copper is carried out using the foundation metal layers 57, 37, 43 as plating current paths, thereby forming the upper metal layers 58, 38, 44 on the surface of the foundation metal layers 57, 37, 43.

Figure 11:
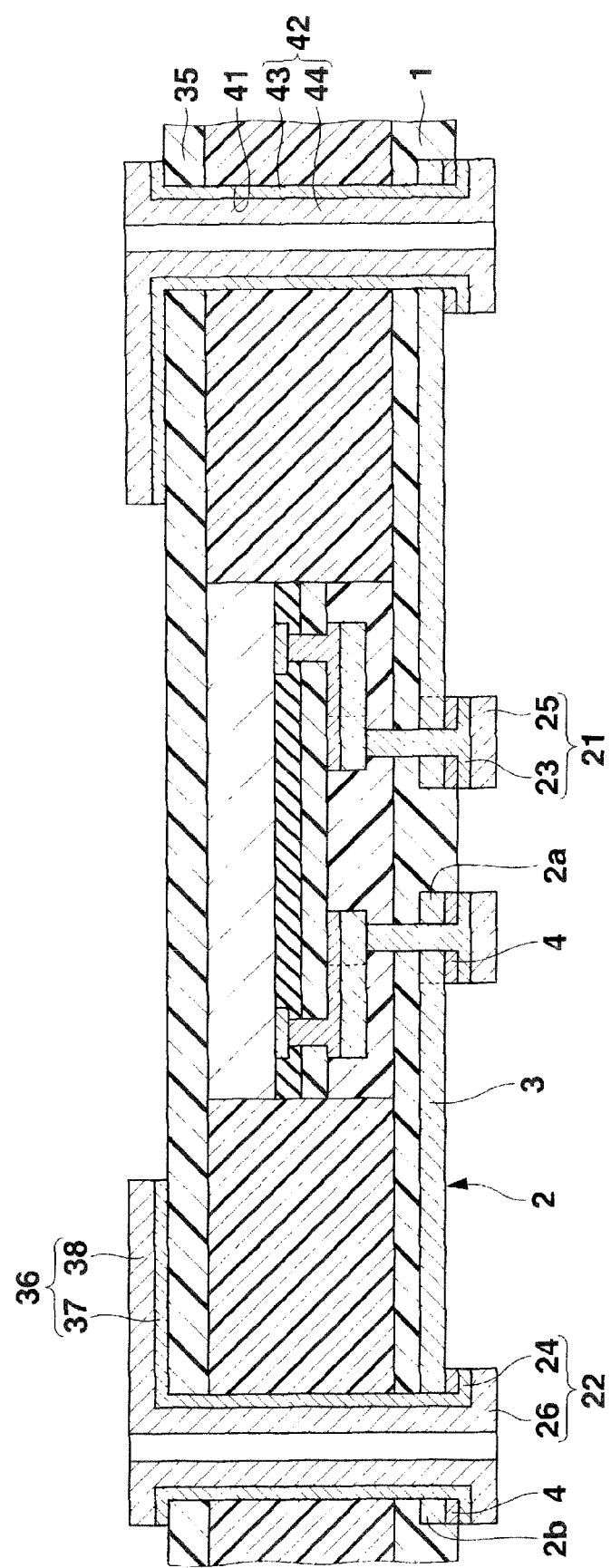
FIG. 11 is a sectional view of a step following FIG. 10.

Then, the upper metal layers 58, 38 and the foundation metal Layers 57, 37 are patterned by the photolithographic method using the same mask, the result of which is as shown in FIG. 11. That is, the first and second connection pad portions 21, 22 having the double-layer structures composed of the foundation metal layers 23, 24 and the upper metal layers 25, 26 are formed on the lower surface of the lower insulating film 1. Further, the upper wiring line 36 having the double-layer structure composed of the foundation metal layer 37 and the upper metal layer 38 is formed on the upper surface of the upper insulating film 35. Still further, the vertical conducting portion 42 having the double-layer structure composed of the foundation metal layer 43 and the upper metal layer 44 is formed on the inner wall surface of the through-hole 41.

Moreover, since the foundation metal layer 4 of the lower wiring line 2 is formed of the same material (nickel) as the foundation metal layer 57, the foundation metal layer 4 in a region other than the first and second connection pad portions 21, 22 is removed, the upper metal layer 3 in this region is exposed. In this state, both ends of the lower wiring line 2 are the connection pad portions 2a, 2b of the double-layer structure composed of the upper metal layer 3 and the foundation metal layer 4. Further, each of the foundation metal layers 4 has the same planar size as the first, second connection pad portion 21, 22. In addition, the first and second connection pad portions 21, 22, the upper wiring line 36 and the vertical conducting portion 42 may be formed by the pattern plating method for forming the upper metal layers 58, 38, 44 through electrolytic plating, after a plating resist film in which an upper metal layer formation region has been removed is formed on the foundation metal layers 57, 37.

Figure 12:
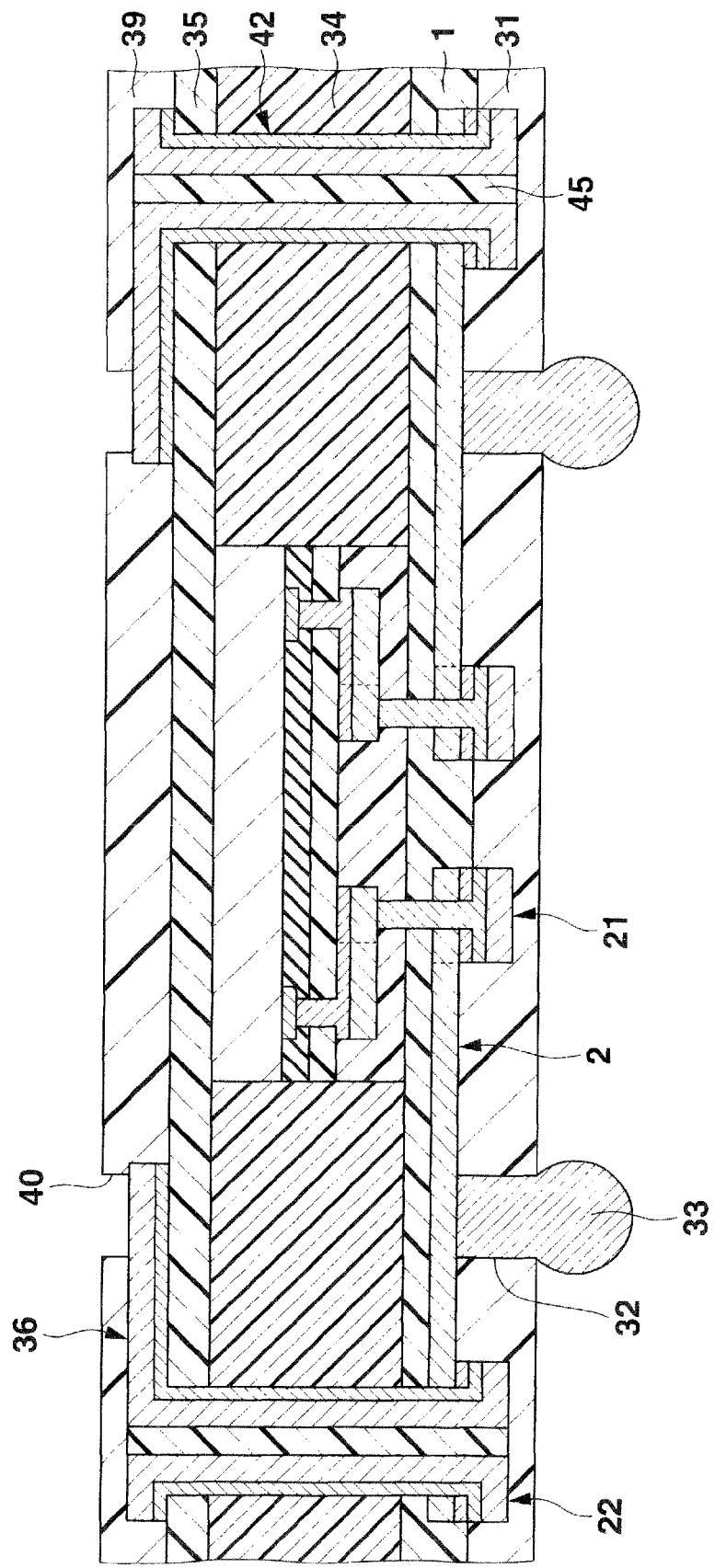
FIG. 12 is a sectional view of a step following FIG. 11.

Then, as shown in FIG. 12, the lower overcoat film 31 made of, for example, a solder resist is formed on the lower surfaces of the lower wiring line 2, the first and second connection pad portions 21, 22 and the lower insulating film 1 by, for example, a screen printing method or a spin coat method. Further, the upper overcoat film 39 made of, for example, a solder resist is formed on the upper surfaces of the upper wiring line 36 and the upper insulating film 35 by, for example, the screen printing method or the spin coat method. In this state, the filling material 45 made of, for example, a solder resist is filled in the vertical conducting portion 42.

Then, the opening 32 is formed by laser processing based on laser beam irradiation in the part of the lower overcoat film 31 corresponding to the connection pad portion of the lower wiring line 2. Further, the opening 40 is formed by laser processing based on laser beam irradiation in the part of the upper overcoat film 39 corresponding to the connection pad portion of the upper wiring line 36.

Then, the solder ball 33 is formed in and under the opening 32 of the lower overcoat film 31 so that this solder ball is connected to the connection pad portion of the lower wiring line 2. Then, the lower overcoat film 31, the lower insulating film 1, the insulating layer 34, the upper insulating film 35 and the upper overcoat film 39 are cut between the adjacent semiconductor constructs 6, such that a plurality of semiconductor devices shown in FIG. 1 are obtained.

In this case, as described above, the appearance test or the conduction test of the lower wiring line 2 is carried out before the installation of the semiconductor construct 6, and the nondefective semiconductor device forming regions are differentiated from the defective semiconductor device forming regions so that the semiconductor constructs 6 are only installed on the nondefective semiconductor device forming regions. Thus, semiconductor devices without the semiconductor constructs 6 are also obtained in addition to the semiconductor devices with the semiconductor constructs 6 shown in FIG. 1.

In the meantime, the yield is in the present situation 80 to 85% in forming the lower wiring line 2 under a rule ranging 50 to 75 μm. This can not satisfy the requirement that the yield be 99.5% or more from the perspective of the cost of the semiconductor device having a configuration as shown in FIG. 1.

Particularly, due to the advance in the miniaturization of the lower wiring line 2, there is a need for a method applicable to a rule ranging 30 to 50 μm and a rule ranging 15 to 25 μm.

In contrast, the manufacturing method described above makes it possible to improve the yield of the semiconductor device having the semiconductor construct 6 even in the case of a low yield in forming the lower wiring line 2. Thus, the expensive semiconductor construct 6 can be effectively used. Moreover, with regard to the lower wiring line 2, the yield can also be improved under a rule ranging 30 to 50 μm and a rule ranging 15 to 25 μm.

Now, in the semiconductor device shown in FIG. 1, if the diameter of the laser beam is sized at about a presently minimum diameter of 50 μm in the step shown in FIG. 8 as described above, the outside diameter of the connection pad portion 2a of the lower wiring line 2 has to be 100 to 120 μm when the accuracy of laser processing is taken into account. Therefore, there is a limit to the miniaturization of the lower wiring line 2. Accordingly, next described will be an embodiment which enables further miniaturization of the lower wiring line 2.

Second Embodiment

Figure 13:
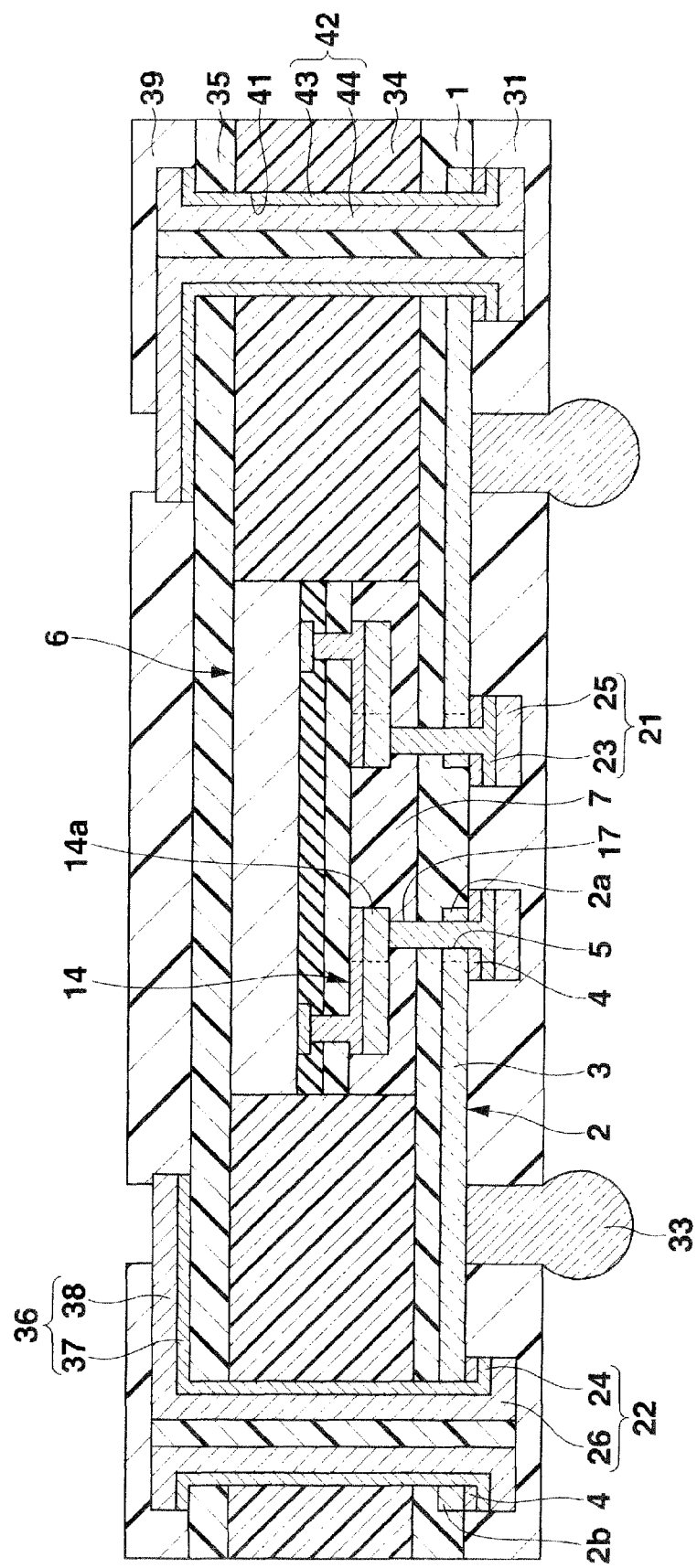
FIG. 13 is a sectional view of a semiconductor device as a second embodiment of this invention.

FIG. 13 shows a sectional view of a semiconductor device as a second embodiment of this invention. This semiconductor device is different from the semiconductor device shown in FIG. 1 in that the outside diameter of an upper metal layer 3 of a connection pad portion 2a of a lower wiring line 2 is substantially equal to the diameter of a connection pad portion 14a of a wiring line 14 of a semiconductor construct 8 and in that a foundation metal layer 4 of the connection pad portion 2a of the lower wiring line 2 is slightly larger than the outside diameter of the upper metal layer 3.

Figure 14:
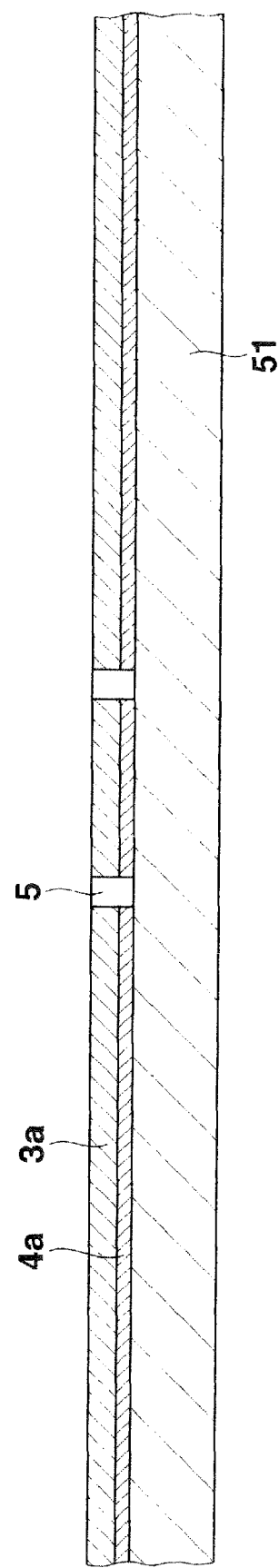
FIG. 14 is a view for explaining one example of a method of manufacturing the semiconductor device in the second embodiment of this invention.
Figure 15:
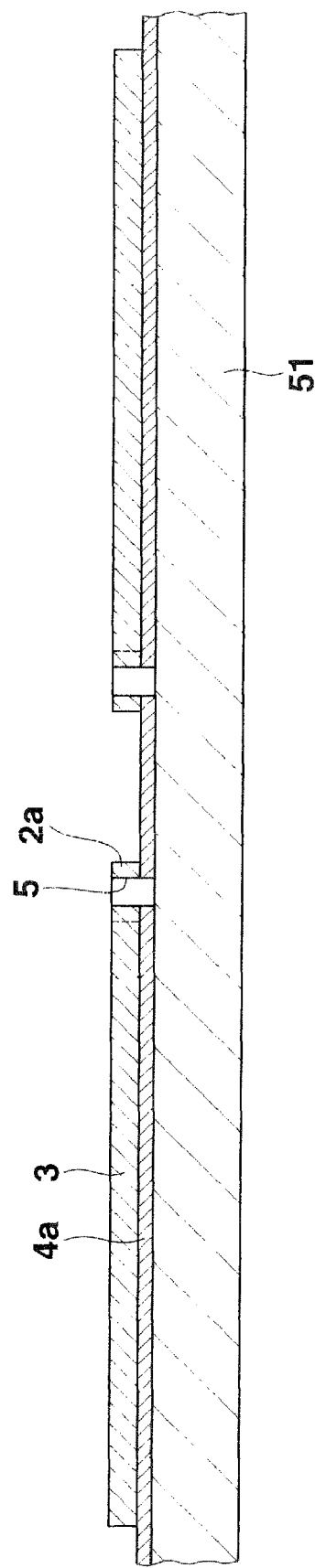
FIG. 15 is a sectional view of a step following FIG. 14.

Next, one example of a method of manufacturing this semiconductor device is described. First, a unit shown in FIG. 2 is prepared. Then, as shown in FIG. 14, an opening 5 is formed in a lower wiring line upper metal layer forming layer 3a and a lower wiring line foundation metal layer forming layer (mask metal layer forming layer) 4a by the photolithographic method. Further, the lower wiring line upper metal layer forming layer 3a alone is patterned by the photolithographic method to form an upper metal layer shaped to be a wiring line in a complete state on the upper surface of the lower wiring line foundation metal layer forming layer 4a as shown in FIG. 15. In this state, the lower wiring line foundation metal layer forming layer 4a is in an initial state and is flatly formed on the entire upper surface of a base plate 51. Moreover, the opening 5 is formed in the center of the connection pad portion 2a of the upper metal layer 3.

Then, an appearance test of the upper metal layer 3 (lower wiring line 2) is carried out. The appearance test is carried out visually or by use of an appearance tester which loads a projected image and compares the projected image with a reference pattern. In a plurality of semiconductor device forming regions on the base plate 51, when it is found by this appearance test that the upper metal layer 3 is formed as desired in a semiconductor device forming region, such a semiconductor device forming regions is judged to be nondefective. When the upper metal layer 3 is not formed as desired in a semiconductor device forming region, such a semiconductor device forming region is judged to be defective. Further, the semiconductor device forming regions are differentiated: the semiconductor device forming regions judged to be nondefective are designated as nondefective semiconductor device forming regions, while the semiconductor device forming regions judged to be defective are designated as defective semiconductor device forming regions.

Figure 16:
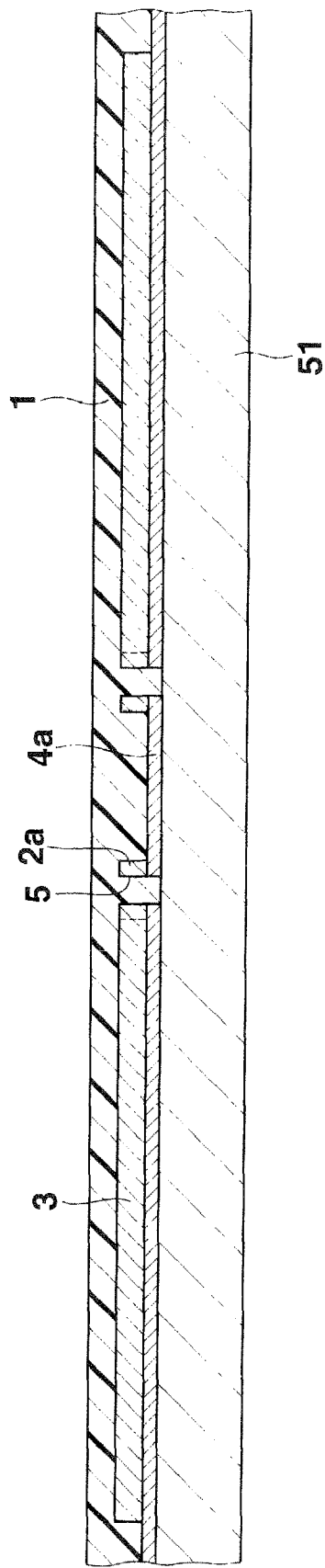
FIG. 16 is a sectional view of a step following FIG. 15.

Then, as shown in FIG. 16, a lower insulating film 1 made of, for example, an epoxy resin, a polyimide resin, or an epoxy resin having a glass cloth base material is formed on the upper surfaces of the upper metal layer 3 and the lower wiring line foundation metal layer forming layer 4a including the inside of the opening 5. In this case as well, a thermosetting resin made of, for example, an epoxy resin in the lower insulating film 1 has been already cured.

Figure 17:
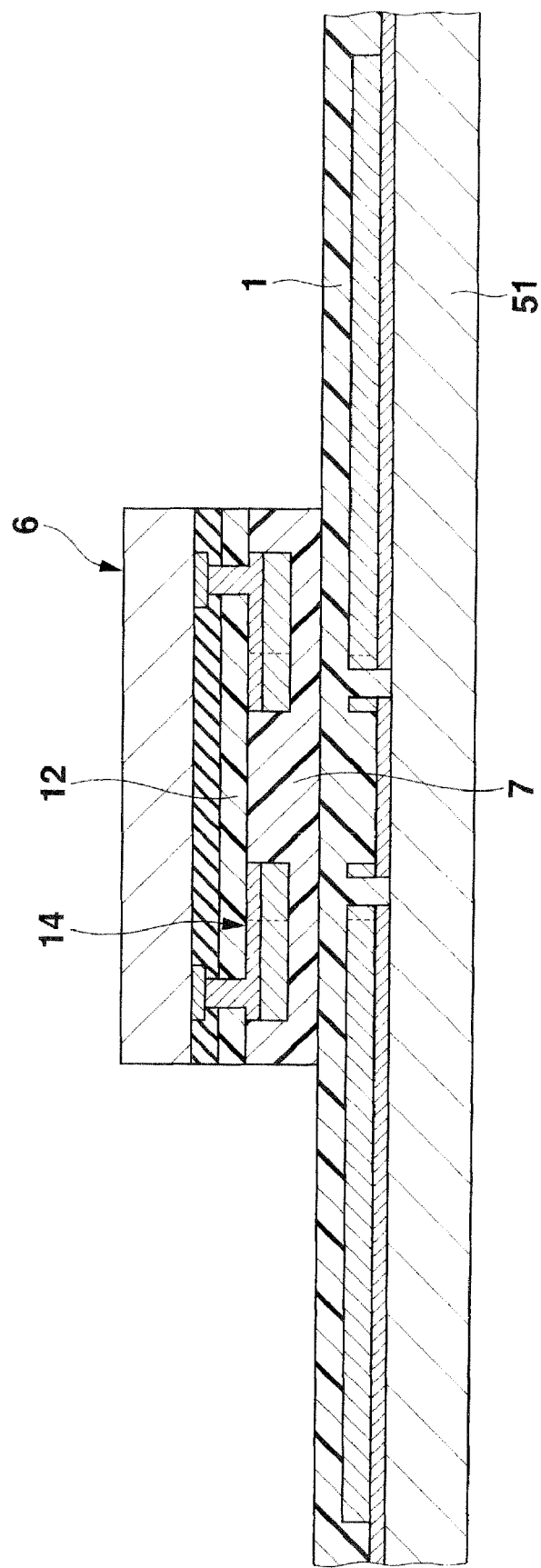
FIG. 17 is a sectional view of a step following FIG. 16.

Then, as shown in FIG. 17, the lower surface of a protective film 12 including the wiring lines 14 of a semiconductor construct 6 is adhesively bonded to a semiconductor construct installation region on the upper surface of the lower insulating film 1 via the adhesive layer 7 made of, for example, an epoxy resin, such that the semiconductor construct 6 is installed thereon. In this case as well, the semiconductor construct installation region on the upper surface of the lower insulating film 1 is previously supplied with an adhesive called an NCP or an adhesive sheet called an NCF, and the semiconductor construct 6 is fixedly connected onto the upper surface of the lower insulating film 1 by hot press bonding.

In this case as well, as described above, an appearance test of the upper metal layer 3 (lower wiring line 2) is carried out, and the plurality of semiconductor device forming regions on the upper surface of the lower insulating film 1 including the upper metal layer 3 are differentiated: the nondefective semiconductor device forming regions and the defective semiconductor device forming regions. Therefore, the semiconductor constructs 6 are only installed on the nondefective semiconductor device forming regions, and the semiconductor constructs 6 are not installed on the defective semiconductor device forming regions.

Figure 18:
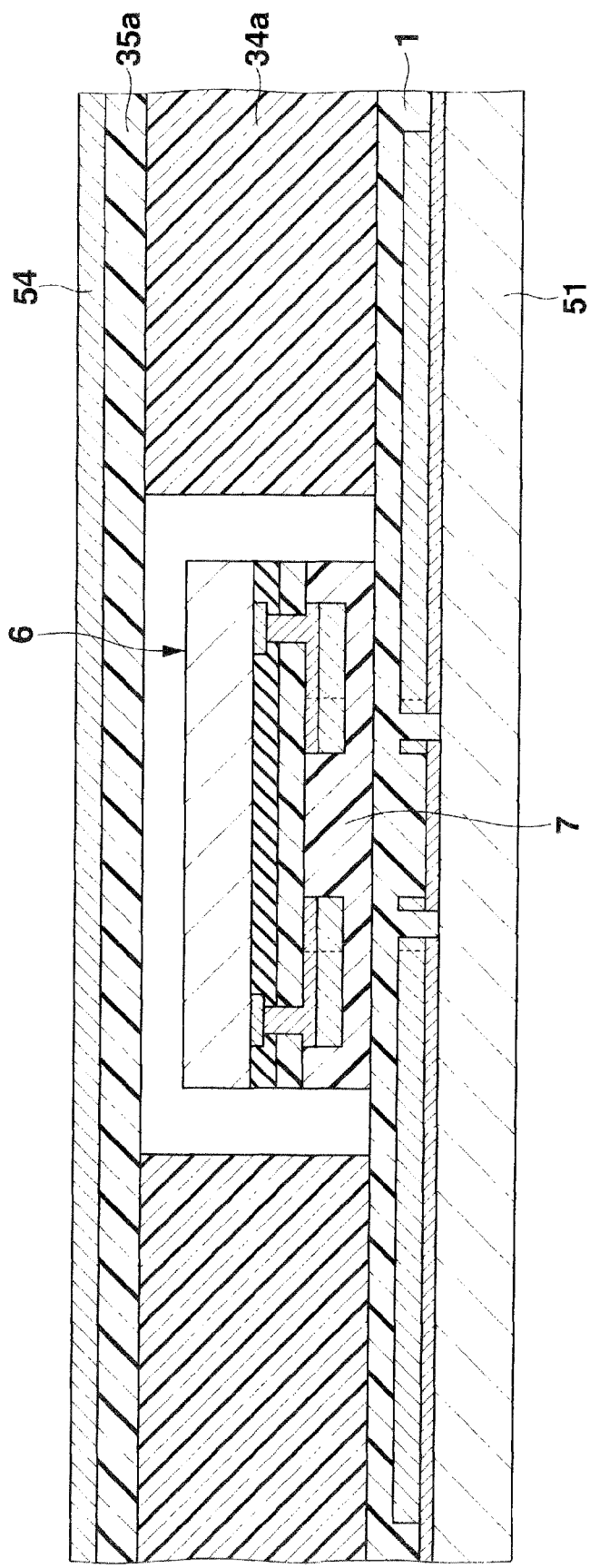
FIG. 18 is a sectional view of a step following FIG. 17.

Then, as shown in FIG. 18, a lattice-shaped insulating film forming sheet 34a is disposed on the upper surface of the lower insulating film 1 around the semiconductor construct 6 including the adhesive layer 7 while being positioned by, for example, pins. Further, an upper insulating film forming layer 35a formed on the lower surface of a sub-base plate 54 made of copper foil is disposed on the upper surface of the insulating film forming sheet 34a.

Figure 19:
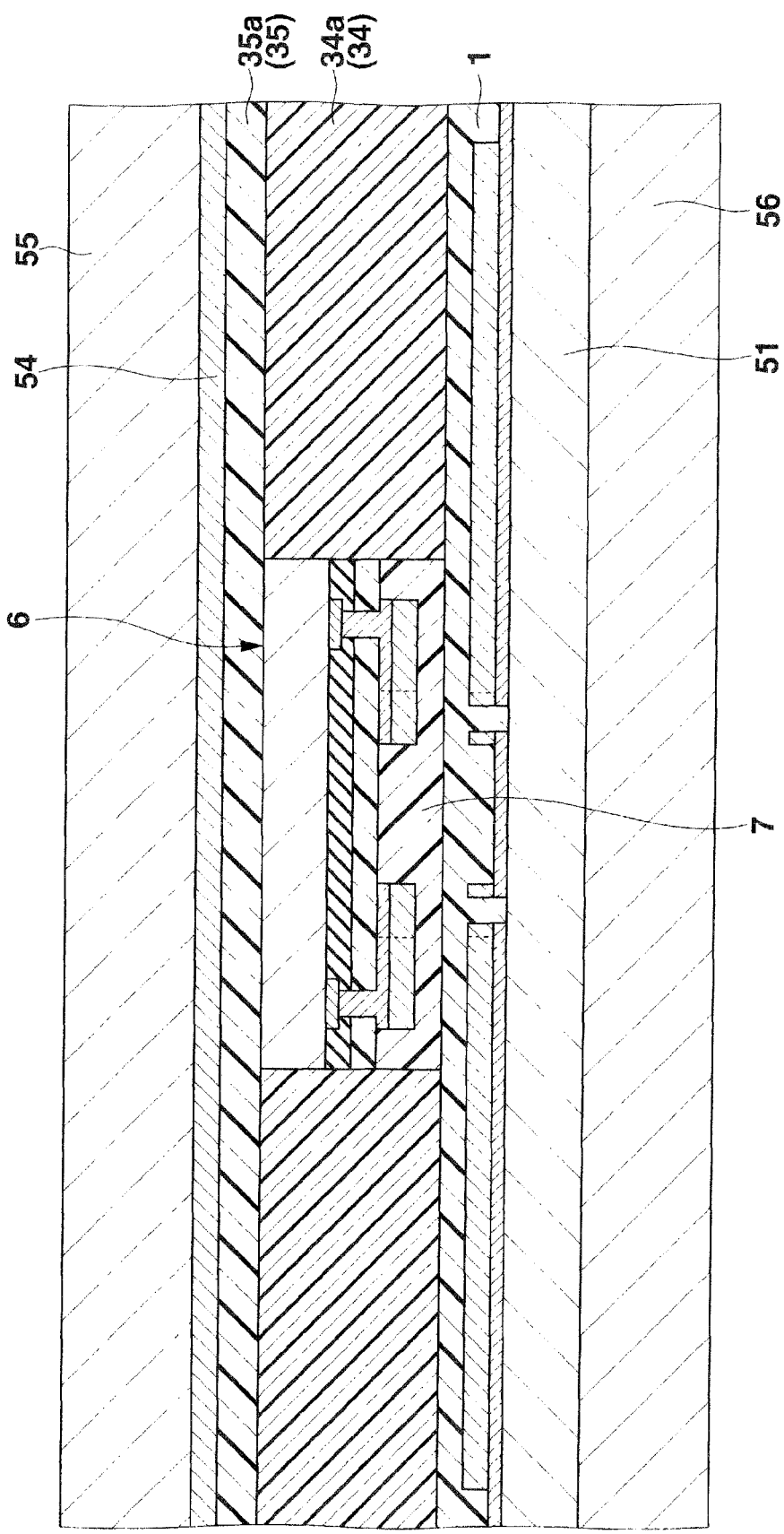
FIG. 19 is a sectional view of a step following FIG. 18.

Then, as shown In FIG. 19, the insulating film forming sheet 34a and the upper insulating film forming layer 35a are hot-pressed from the top and bottom using a pair of hot-pressing plates 55, 56. Thus, the insulating layer 34 is formed on the upper surface of the lower insulating film 1 around the semiconductor construct 6 including the adhesive layer 7, and the upper insulating film 35 is formed on the upper surfaces of the semiconductor construct 6 and the insulating layer 34.

Figure 20:
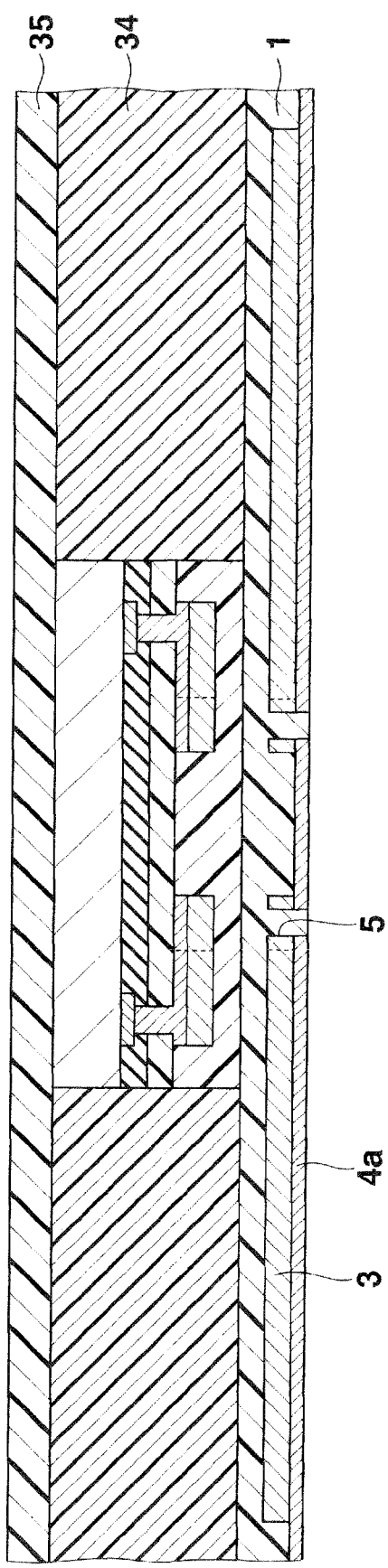
FIG. 20 is a sectional view of a step following FIG. 19.

Then, the base plate 51 and the sub-base plate 54 are removed by etching, such that the lower surface of the lower wiring line foundation metal layer forming layer 4a is exposed, and the upper surface of the upper insulating film 35 is also exposed, as shown in FIG. 20. In this state, even if the base plate 51 and the sub-base plate 54 are removed, sufficient strength can be assured owing to the presence of the lower insulating film 1, the insulating layer 34 and the upper insulating film 35. Moreover, the lower insulating film 1 is filled in the opening 5 of the upper metal layer 3 and the lower wiring line foundation metal layer forming layer 4a.

Figure 21:
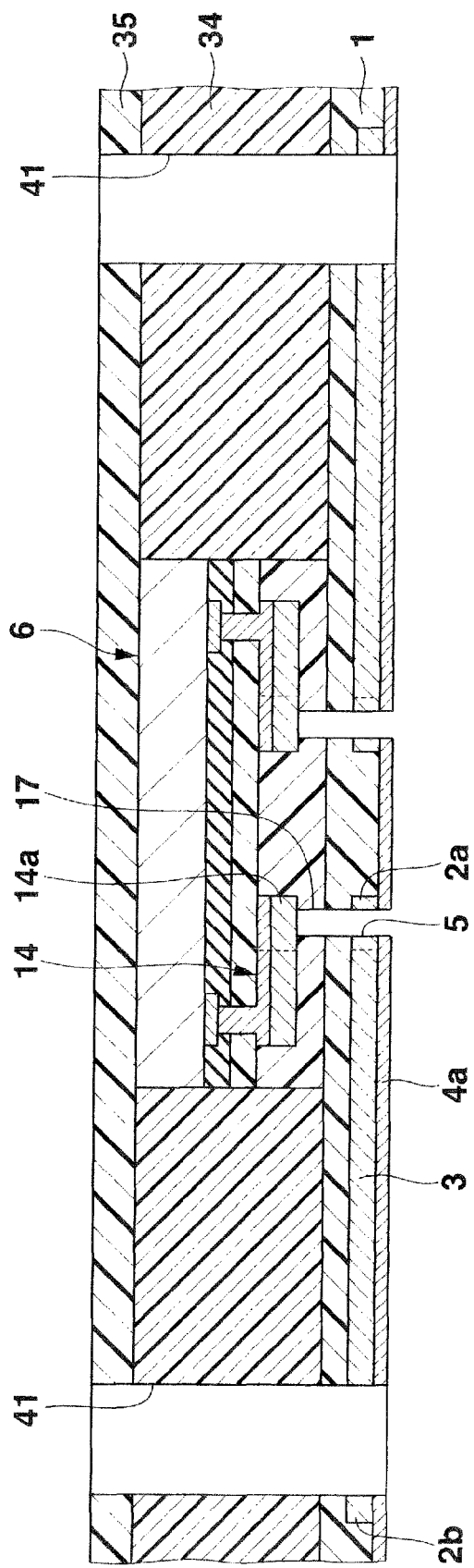
FIG. 21 is a sectional view of a step following FIG. 20.

Then, as shown in FIG. 21, by laser processing based on laser beam irradiation, the lower insulating film 1 in the opening 5 of the upper metal layer 3 and the lower wiring line foundation metal layer forming layer 4a is removed, and an opening 17 is formed in parts of the lower insulating film 1 and the adhesive layer 7 corresponding to the center of the lower surface of the connection pad portion 14a of the wiring line 14 of the semiconductor construct 6. Further, a through-hole 41 is formed by use of a mechanical drill or by laser processing based on laser beam irradiation in the center of a connection pad portion 2b of the upper metal layer 3 and in parts of the lower insulating film 1, the insulating layer 34 and the upper insulating film 35 that correspond to the center of the connection pad portion 2b.

Here, the outside diameter of the connection pad portion 2a of the upper metal layer is substantially equal to the diameter of the connection pad portion 14a of the wiring line 14 of the semiconductor construct 6. However, as the lower wiring line foundation metal layer forming layer 4a having the opening 5 is formed on the entire lower surface of the lower insulating film 1 including the upper metal layer 3, the lower wiring line foundation metal layer forming layer 4a having the opening 5 functions as a mask even if the diameter of the laser beam is larger than the outside diameter of the connection pad portion 2a of the upper metal layer 3. As a result, the outside diameter of the connection pad portion 2a of the upper metal layer 3 can be as small as possible, and the upper metal layer 3 (lower wiring line 2) can be further miniaturized.

For example, even if the diameter of the laser beam is sized at about a presently minimum diameter of 50 μm, the diameter of the opening 5 of the connection pad portion 2a of the upper metal layer 3 formed by the photolithographic method can be 20 to 50 μm, in particular, 20 to 30 μm. Therefore, the outside diameter of the connection pad portion 2a of the upper metal layer 3 can be 50 to 80 μm, in particular, 50 to 60 μm, and the upper metal layer 3 (lower wiring line 2) can be further miniaturized.

Figure 22:
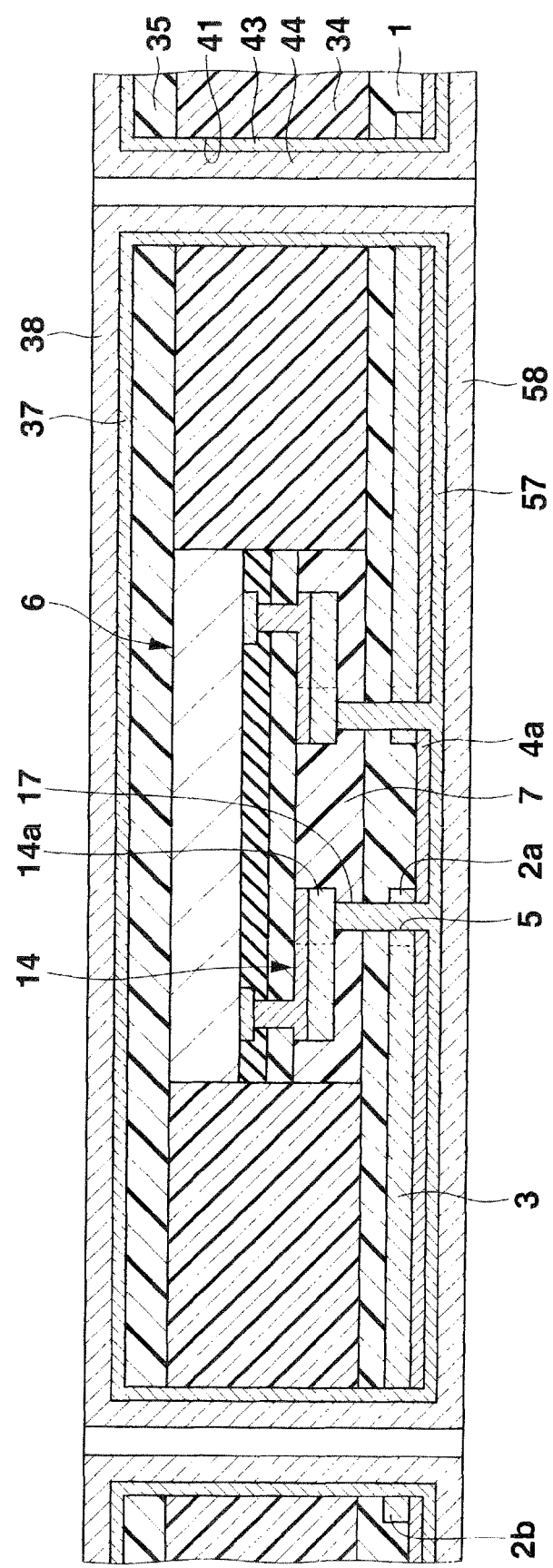
FIG. 22 is a sectional view of a step following FIG. 21.

Then, as shown in FIG. 22, foundation metal layers 51, 37, 43 are formed by electroless plating with nickel on the entire lower surface of the lower wiring line foundation metal layer forming layer 4a including the lower surface of the connection pad portion 14a of the wiring line 14 of the semiconductor construct 6 exposed via the opening 5 of the upper metal layer 3 and the lower wiring line foundation metal layer forming layer 4a and via the opening 17 in the lower insulating film 1 and the adhesive layer 7, on the entire upper surface of the upper insulating film 35, and on the inner wall surface of the through-hole 41. Further, electrolytic plating with copper is carried out using the foundation metal layers 57, 37, 43 as plating current paths, thereby forming the upper metal layers 58, 38, 44 on the surface of the foundation metal layers 57, 37, 43.

Figure 23:
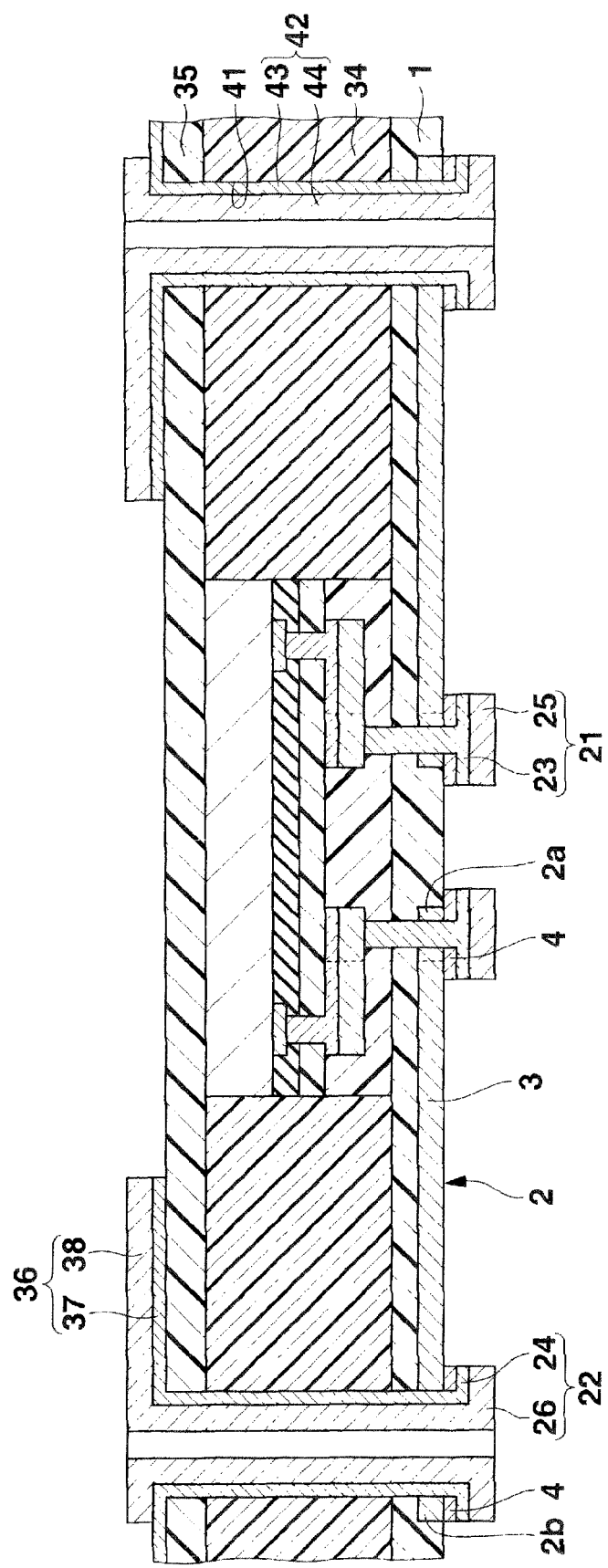
FIG. 23 is a sectional view of a step following FIG. 22.

Then, the upper metal layers 58, 38 and the foundation metal layers 57, 37 are patterned by the photolithographic method using the same mask, the result of which is as shown in FIG. 23. That is, first and second connection pad portions 21, 22 having double-layer structures composed of foundation metal layers 23, 24 and upper metal layers 25, 26 are formed on the lower surface of the lower insulating film 1. Further, an upper wiring line 36 having a double-layer structure composed of the foundation metal layer 37 and the upper metal layer 38 is formed on the upper surface of the upper insulating film 35. Still further, a vertical conducting portion 42 having a double-layer structure composed of the foundation metal layer 43 and the upper metal layer 44 is formed on the inner wall surface of the through-hole 41.

Here, the connection pad portion 14a and the upper metal layer 3 of the connection pad portion 2a can be smaller in diameter than the first connection pad portion 21, so that the density of the semiconductor construct 6 can be further increased. In addition, the connection pad portions 14a, 2a have a circular planar shape in the embodiment described above. However, the present invention is not limited to this. The planar shape of the opening can be a polygonal shape. In that case, the planar sizes of the connection pad portion 14a and the upper metal layer 3 of the connection pad portion 2a can be smaller than that of the first connection pad portion 21.

Moreover, since the lower wiring line foundation metal layer forming layer 4a is formed of the same material (nickel) as the foundation metal layer 57, the lower wiring line foundation metal layer forming layer 4a in a region other than the first and second connection pad portions 21, 22 is removed, and the upper metal layer 3 in this region is exposed. In this state, both ends of the lower wiring line 2 are the connection pad portions 2a, 2b of the double-layer structure composed of the upper metal layer 3 and the foundation metal layer 4. In addition, the first and second connection pad portions 21, 22, the upper wiring line 36 and the vertical conducting portion 42 may he formed by the pattern plating method.

Subsequently, after steps similar to those in the first embodiment described above, a plurality of semiconductor devices shown in FIG. 13 are obtained. In this case as well, as described above, the semiconductor constructs 6 are not installed on the defective semiconductor device forming regions. Thus, semiconductor devices without the semiconductor constructs 6 are also obtained in addition to the semiconductor devices with the semiconductor constructs 6 shown in FIG. 13. Thus, the yield can be improved as in the first embodiment.

Third Embodiment

Figure 24:
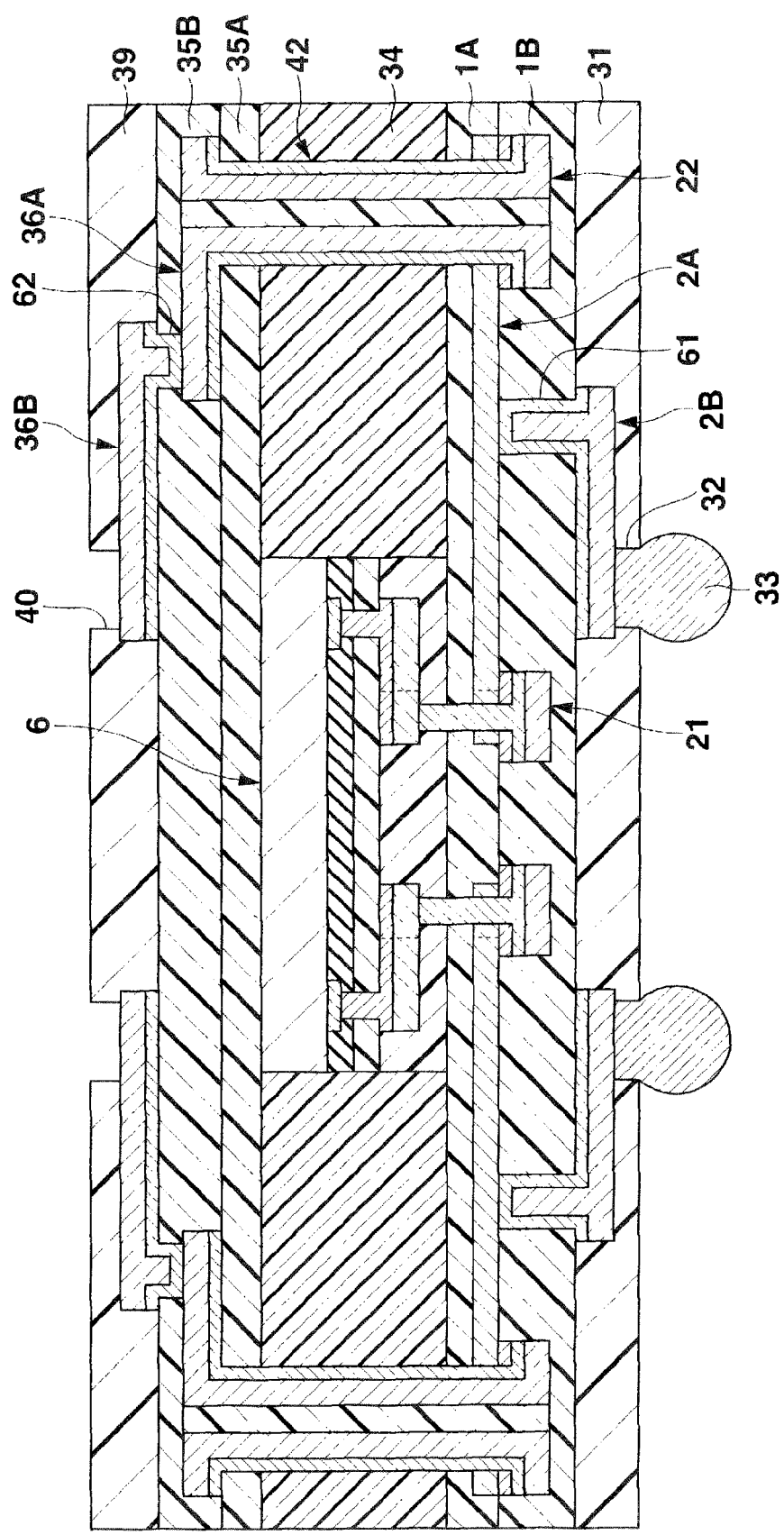
FIG. 24 is a sectional view of a semiconductor device as a third embodiment of this invention.

FIG. 24 shows a sectional view of a semiconductor device as a third embodiment of this invention. This semiconductor device is greatly different from the semiconductor device shown in FIG. 13 in that both a lower wiring line and an upper wiring line are formed to have a double-layer wiring structure by a build-up method. That is, a second lower insulating film 1B made of the same material as a first lower insulating film 1A is provided on the lower surface of a first lower wiring line 2A including first and second connection pad portions 21, 22 and on the lower surface of the first lower insulating film 1A.

One end of a second lower wiring line 2B provided on the lower surface of the second lower insulating film 1B is connected to the connection pad portion of the first lower wiring line 2A via an opening 61 provided in the second lower insulating film 1B. A lower overcoat film 31 is provided on the lower surface of the second lower insulating film 1B including the second lower wiring line 2B. A solder ball 33 is provided in and under an opening 32 of the lower overcoat film 31 so that this solder ball is connected to the connection pad portion of the second lower wiring line 2B.

A second upper insulating film 35B made of the same material as a first upper insulating film 35A is provided on the upper surface of the first upper insulating film 35A including a first upper wiring line 36A. One end of a second upper wiring line 36B provided on the upper surface of the second upper insulating film 35B is connected to the connection pad portion of the first upper wiring line 36A via an opening 62 provided in the second upper insulating film 35B. An upper overcoat film 39 is provided on the upper surface of the second upper insulating film 35B including the second upper wiring line 36B. An opening 40 is provided in the part of the upper overcoat film 39 corresponding to the connection pad portion of the second upper wiring line 36B. In addition, both the lower wiring line and the upper wiring line may have a wiring structure of three or more layers.

Fourth Embodiment

Figure 25:
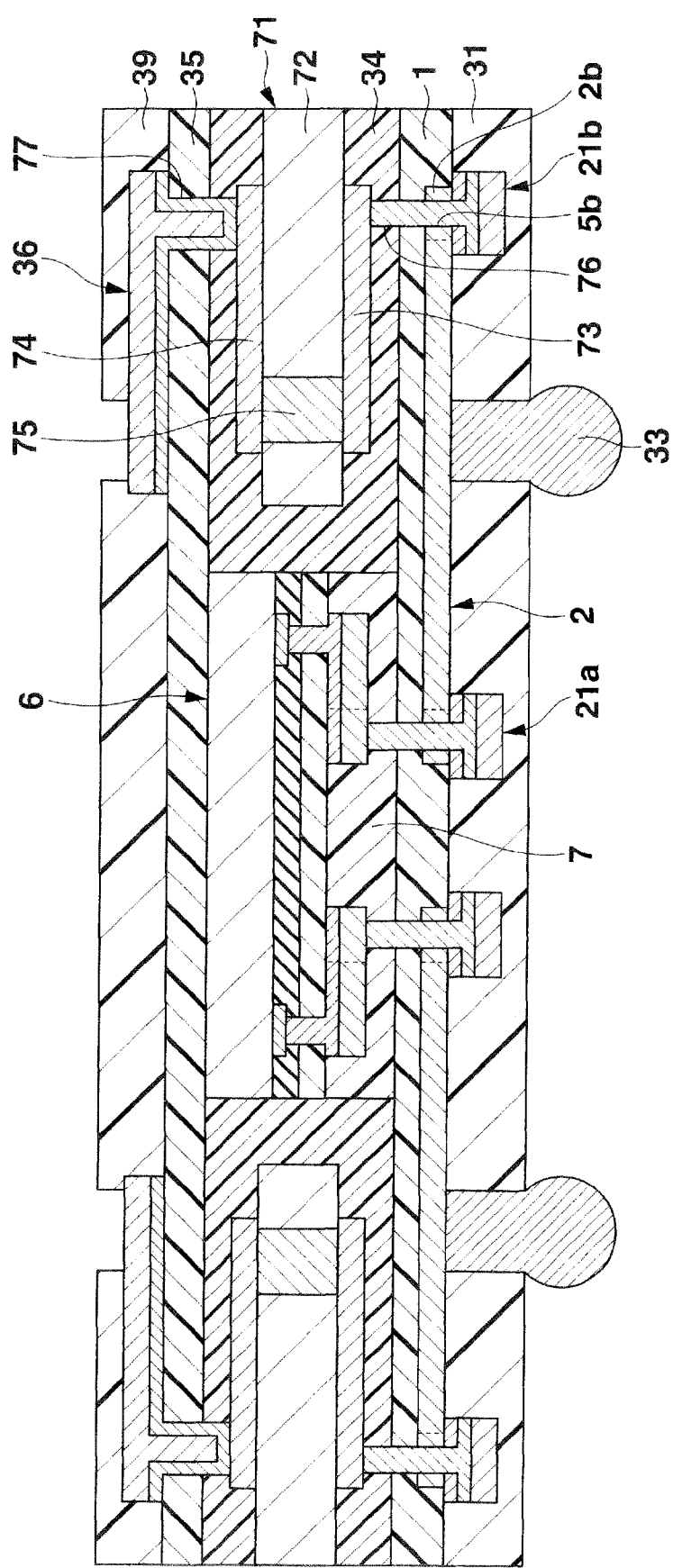
FIG. 25 is a sectional view of a semiconductor device as a fourth embodiment of this invention.

FIG. 25 shows a sectional view of a semiconductor device as a fourth embodiment of this invention. This semiconductor device is greatly different from the semiconductor device shown in FIG. 13 in that no vertical conducting portion 42 is provided, but a square frame-like circuit board 71 having a double-sided wiring structure is disposed instead in such a manner as to be embedded into an insulating layer 34 around a semiconductor construct 6 including an adhesive layer 7.

In this case, the circuit board 71 comprises a square frame-like substrate 72 made of, for example, an epoxy resin having a glass cloth base material. A lower wiring line 73 made of copper foil is provided on the lower surface of the substrate 72, while an upper wiring line 74 made of copper foil is disposed on the upper surface thereof. The lower wiring line 73 and the upper wiring line 74 are connected to each other via a vertical conducting portion 75 made of a conductive paste provided within the substrate 72.

A connection pad portion 2b of a lower wiring line 2 is connected to the connection pad portion of the lower wiring line 73 of the circuit board 71 via a connection pad portion 21b having the same structure as a connection pad portion 21a. That is, the connection pad portion 21b is connected to the connection pad portion of the lower wiring line 73 of the circuit board 71 via an opening 5b of the connection pad portion 2b of the lower wiring line 2 and via an opening 76 provided in a lower insulating film 1 and the insulating layer 34. An upper wiring line 36 is connected to the connection pad portion of the upper wiring line 74 of the circuit board 71 via an opening 77 provided in an upper insulating film 35 and the insulating layer 34.

Figure 26:
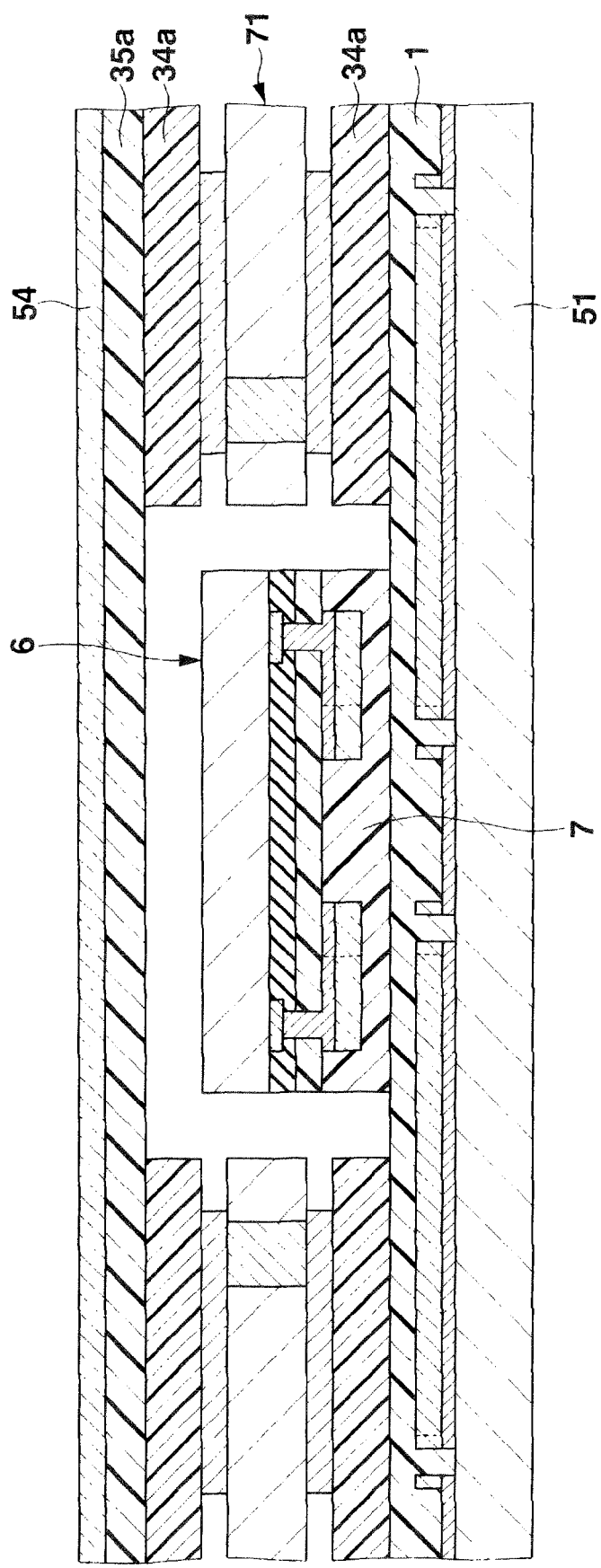
FIG. 26 is a view for explaining one example of a method of manufacturing the semiconductor device shown in FIG. 25.

Next, one example of a method of manufacturing this semiconductor device is described. In this case, in a step as shown in FIG. 18, a lattice-shaped insulating film forming sheet 34a and the lattice-shaped circuit board 71 are disposed on the upper surface of the lower insulating film 1 around a semiconductor construct 6 including an adhesive layer 7 while being positioned by, for example, pins, as shown in FIG. 26. Further, an upper insulating film forming layer 35a formed on the lower surface of a sub-base plate 54 is disposed on the upper surface of the upper insulating film forming sheet 34a.

Figure 27:
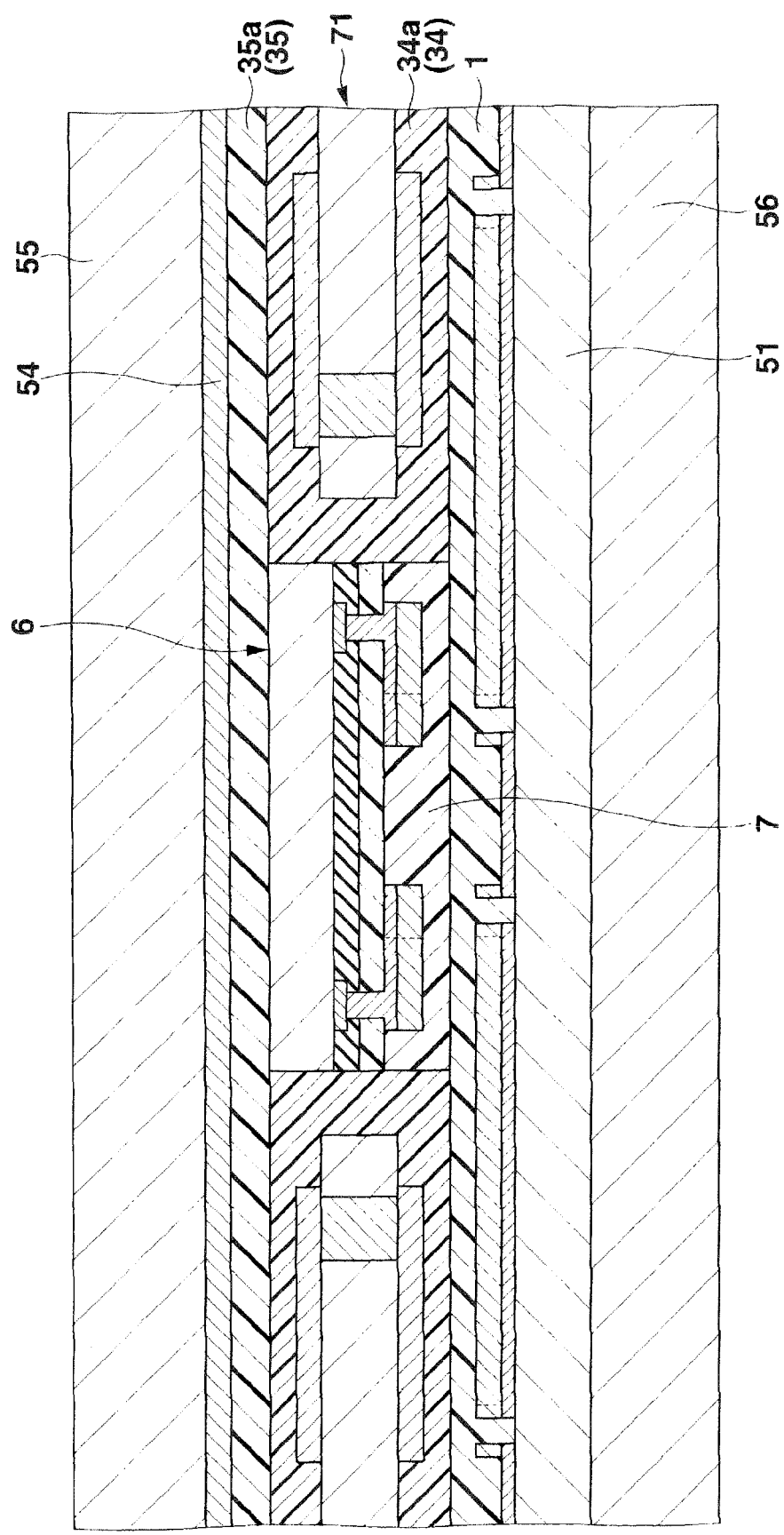
FIG. 27 is a sectional view of a step following FIG. 26.
Figure 28:
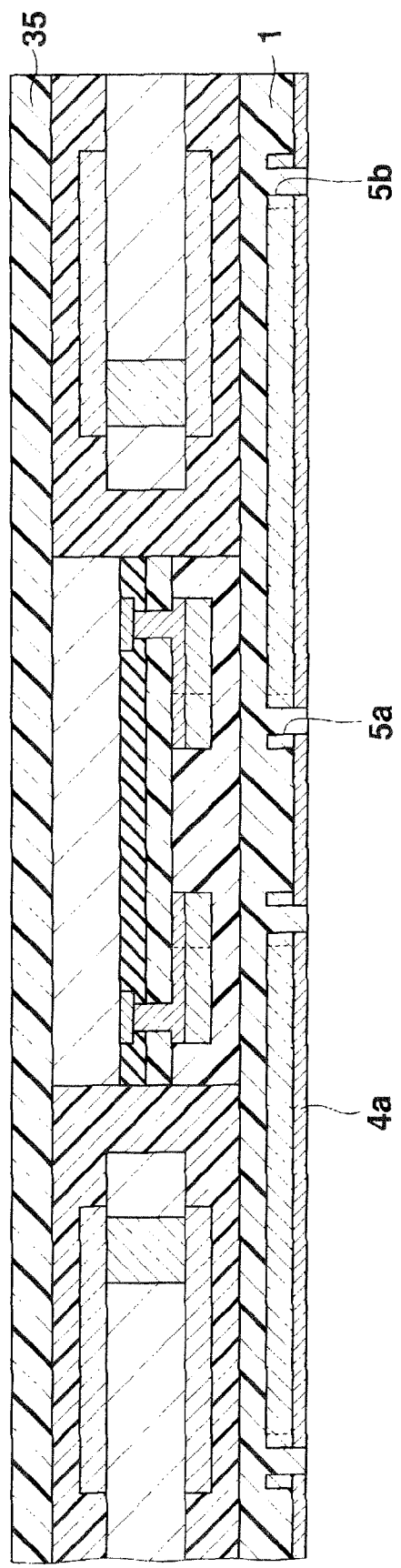
FIG. 28 is a sectional view of a step following FIG. 27.

Then, as shown in FIG. 27, owing to hot press from the top and bottom using a pair of hot-pressing plates 55, 56, the insulating layer 34 is formed on the upper surface of the lower insulating film 1 around the semiconductor construct 6 including the adhesive layer 7, and the circuit board 71 is embedded in the insulating layer 34, so that the upper insulating film 35 is formed on the upper surfaces of the semiconductor construct 6 and the insulating layer 34. Further, a base plate 51 and the sub-base plate 54 are removed by etching, such that the lower surfaces of a foundation metal layer 4a and the lower insulating film 1 filled in openings 5a, 5b are exposed, and the upper surface of the upper insulating film 35 is also exposed, as shown in FIG. 28.

Figure 29:
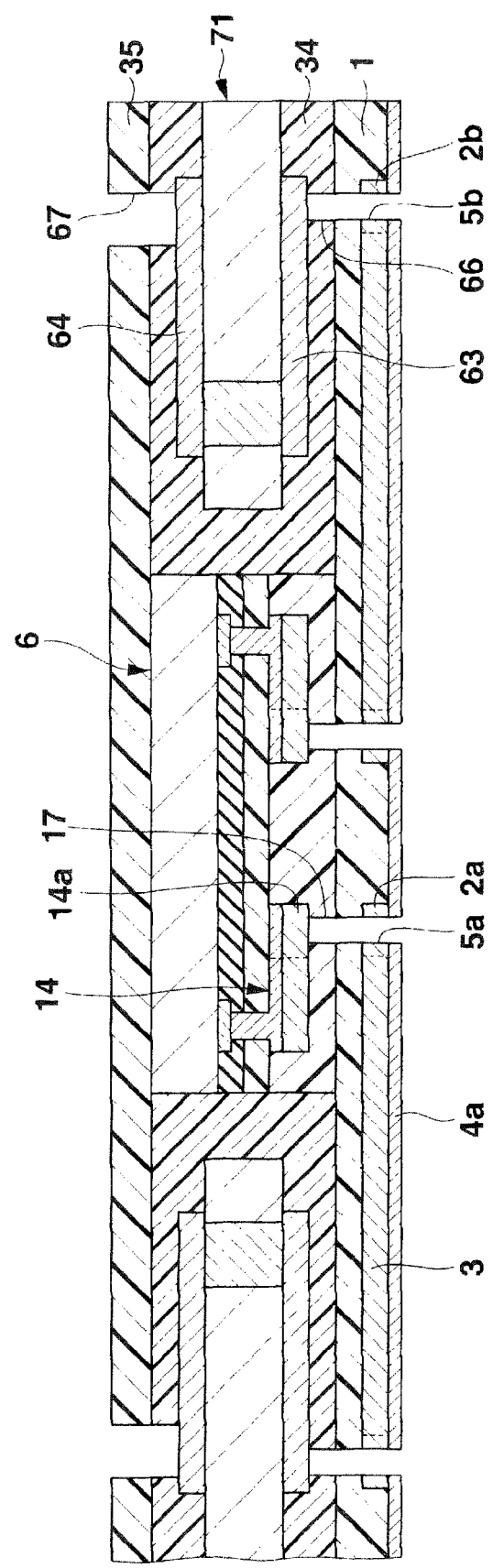
FIG. 29 is a sectional view of a step following FIG. 28.

Then, as shown in FIG. 29, the lower insulating film 1 in the opening 5a is removed by laser processing based on laser beam irradiation, and an opening 17 is formed in parts of the lower insulating film 1 and the adhesive layer 7 corresponding to the center of the lower surface of a connection pad portion 14a of a wiring line 14 of the semiconductor construct 6. Moreover, by laser processing based on laser beam irradiation, the lower insulating film 1 in the opening 5a is removed, and the opening 76 is formed in parts of the lower insulating film 1 and the adhesive layer 7 corresponding to the connection pad portion of the lower wiring line 73 of the circuit board 71. In this case, the diameter of the opening 76 is equal to the diameter of the opening 17.

Then, the opening 77 is formed in a part of the upper insulating film 35 corresponding to the connection pad portion of the upper wiring line 74 of the circuit board 71 by laser processing based on laser beam irradiation. In this case, the diameter of the opening 77 is greater than the diameter of the opening 17. Subsequently, after steps similar to those in the second embodiment described above, a plurality of semiconductor devices shown in FIG. 25 are obtained.

As compared with the semiconductor device shown in FIG. 24, the lower insulating film and the upper insulating film are single-layered even when the lower wiring line and the upper wiring line have a double-layer structure in the semiconductor device obtained as described above, so that the thickness can be reduced accordingly. Moreover, as no vertical conducting portion 42 is provided, there is no need to form a through-hole 41 by a mechanical drill.

Fifth Embodiment

Figure 30:
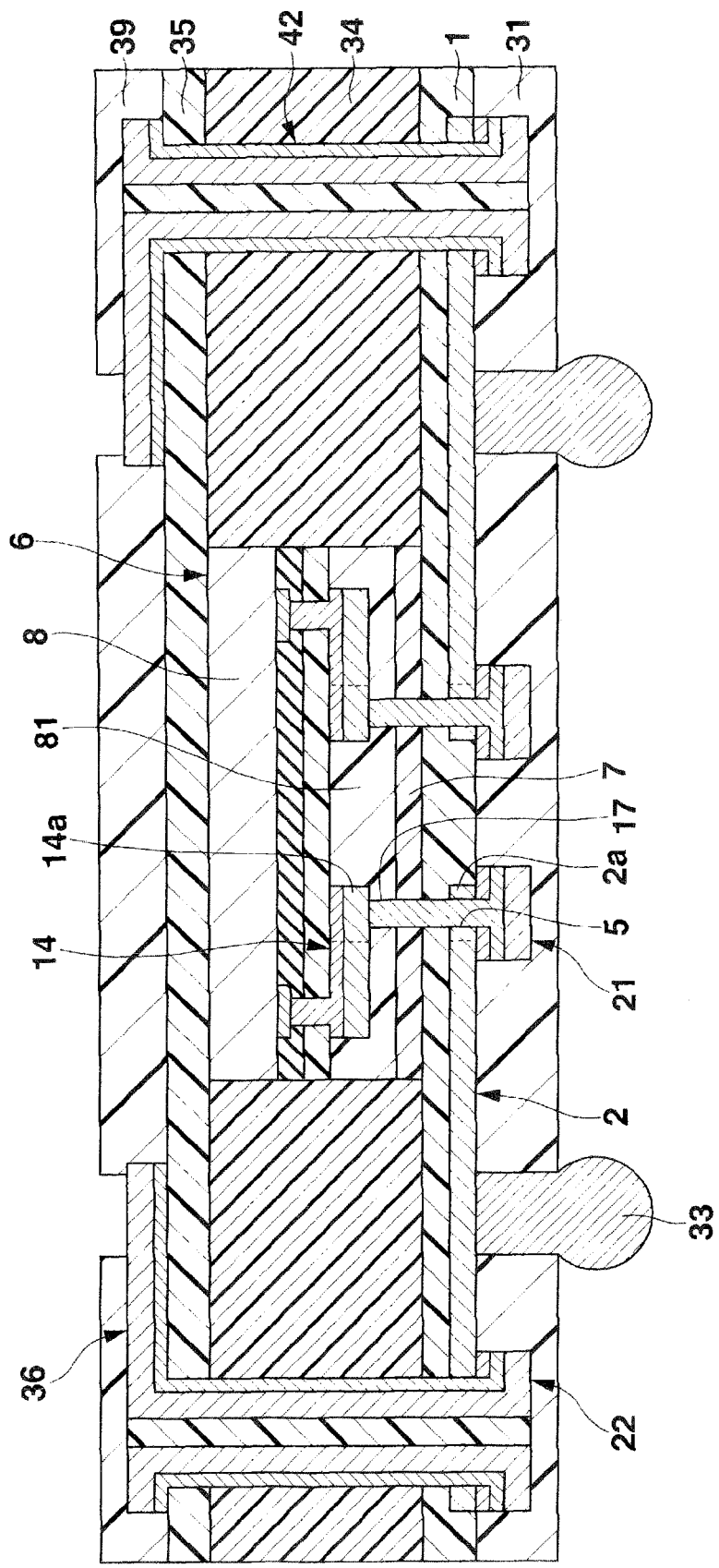
FIG. 30 is a sectional view of a semiconductor device as a fifth embodiment of this invention.

FIG. 30 shows a sectional view of a semiconductor device as a fifth embodiment of this invention. This semiconductor device is different from the semiconductor device shown in FIG. 13 in that an antistatic protective film 81 made of an insulating material such as a polyimide resin or an epoxy resin is provided on the lower surface of a protective film 12 including wiring lines 14 of a semiconductor construct 6.

Therefore, in this case, the lower surface of the antistatic protective film 81 of the semiconductor construct 6 is adhesively bonded to the center of the upper surface of a lower insulating film 1 via an adhesive layer 7. A first connection pad portion 21 is connected to a connection pad portion 14a of the wiring line 14 of the semiconductor construct 6 via an opening 5 of a connection pad portion 2a of a lower wiring line 2 and via an opening 17 of the lower insulating film 1, the adhesive layer 7 and the antistatic protective film 81.

In the meantime, the opening 17 is not formed in the antistatic protective film 81 before the semiconductor construct 6 is installed on the lower insulating film 1. Then, the antistatic protective film 81 having no opening 17 protects an integrated circuit formed under a silicon substrate 8 against static electricity from the point where the antistatic protective film 81 is formed under the silicon substrate 8 in a wafer state to the point where the semiconductor construct 6 is installed on the lower insulating film 1.

Sixth Embodiment

Figure 31:
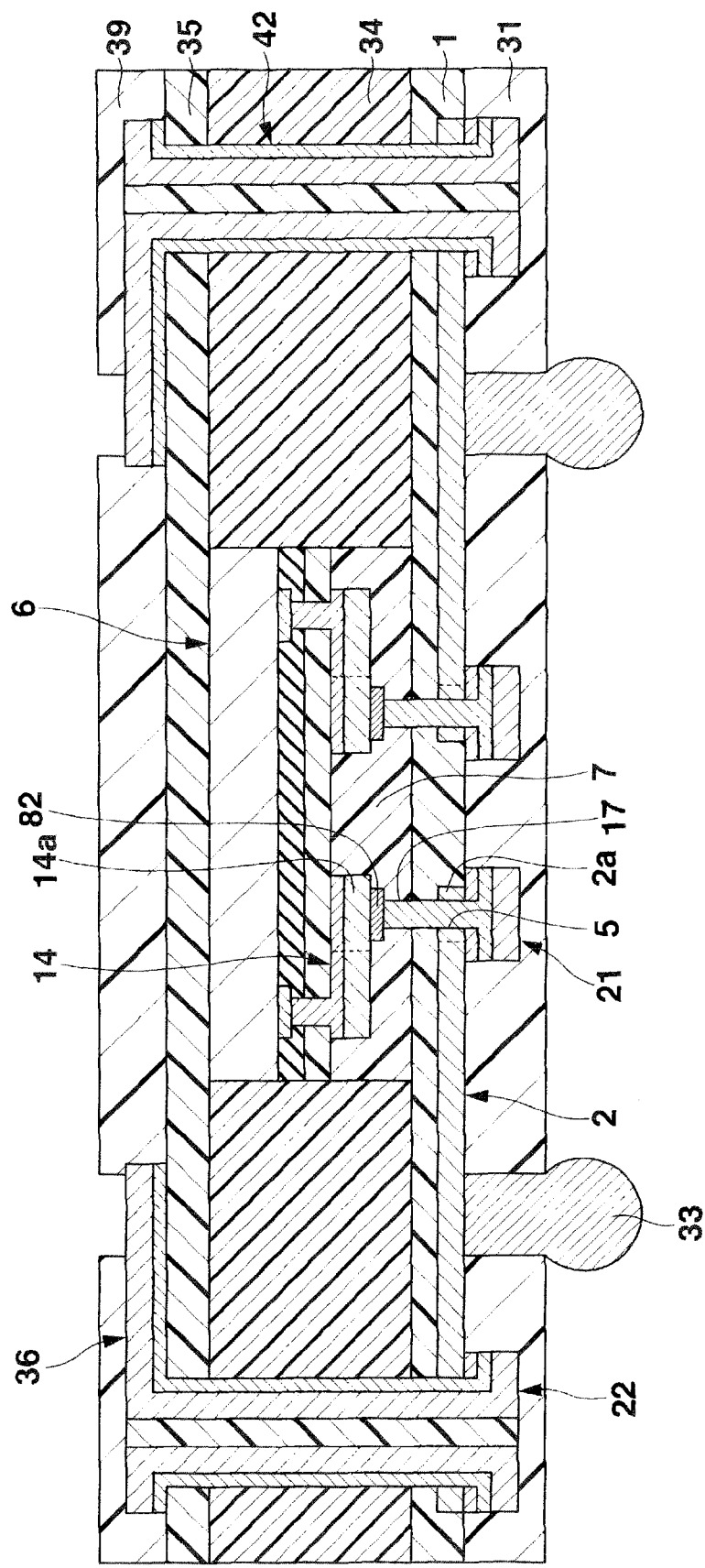
FIG. 31 is a sectional view of a semiconductor device as a sixth embodiment of this invention.

FIG. 31 shows a sectional view of a semiconductor device as a sixth embodiment of this invention. This semiconductor device is different from the semiconductor device shown in FIG. 13 in that a protective metal layer 82 made of electrolytic copper plating is provided on the lower surface of a connection pad portion 14a of a wiring line 14 of a semiconductor construct 6. In this case, the protective metal layer 82 protects the connection pad portion 14a of the wiring line 14 when a laser beam is applied. That is, the wiring line 14 is formed with a thickness of 5 to 10 μm, and a protective layer 87 is formed with a thickness of several μm on the connection pad portion 14a of the wiring line 14 alone in such a manner as to allow for the amount of etching by the laser beam, such that the thickness of the semiconductor construct 6 can be smaller.

Seventh Embodiment

Figure 32:
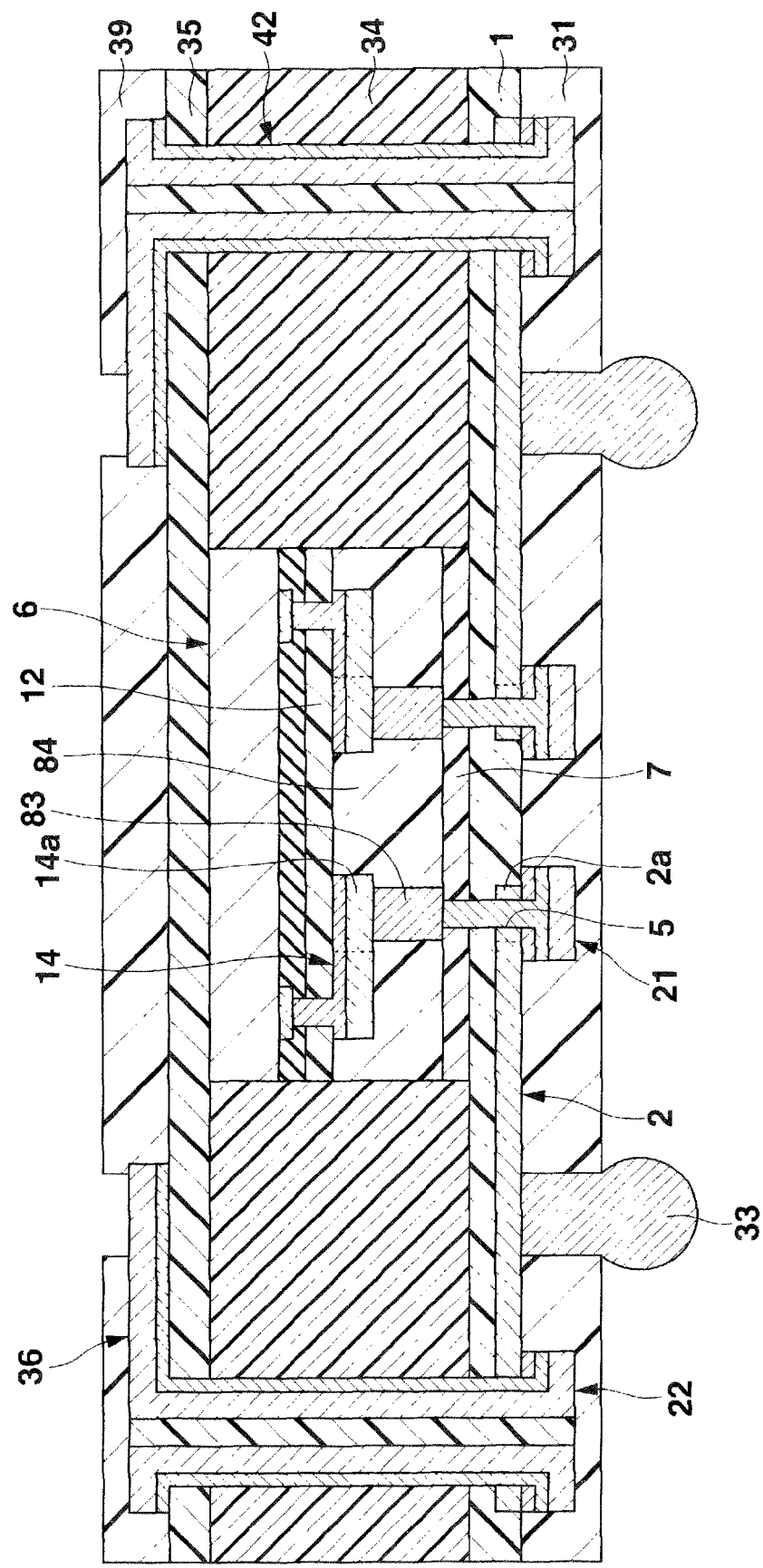
FIG. 32 is a sectional view of a semiconductor device as a seventh embodiment of this invention.

FIG. 32 shows a sectional view of a semiconductor device as a seventh embodiment of this invention. This semiconductor device is different from the semiconductor device shown in FIG. 13 in that a columnar electrode (external connection electrode) 83 made of electrolytic copper plating is provided in the center of the lower surface of a connection pad portion 14a of a wiring line 14 of a semiconductor construct 6 and in that a sealing film 84 made of, for example, an epoxy resin is provided on the lower surface of a protective film 12 including the wiring line 14 so that the lower surface of this sealing film 84 is flush with the lower surface of the columnar electrode 83.

Therefore, in this case, the lower surface of the sealing film 84 including the columnar electrode 83 is adhesively bonded to the center of the upper surface of a lower insulating film 1 via an adhesive layer 7. A first connection pad portion 21 is connected to the columnar electrode 83 of the semiconductor construct 6 via an opening 5 of a connection pad portion 2a of a lower wiring line 2 and via an opening 17 of the lower insulating film 1 and the adhesive layer 7.

Eighth Embodiment

Figure 33:
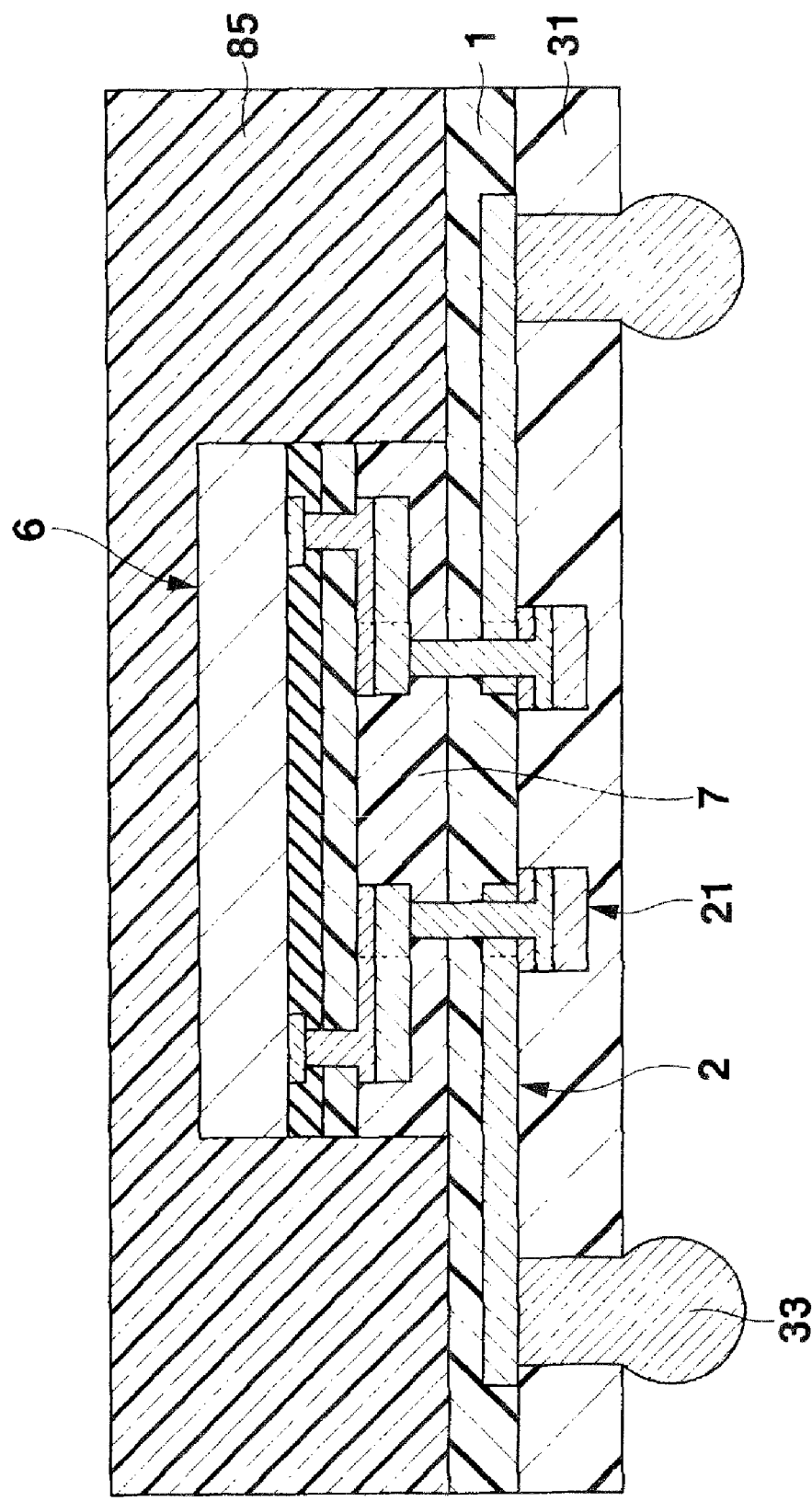
FIG. 33 is a sectional view of a semiconductor device as an eighth embodiment of this invention.

FIG. 33 shows a sectional view of a semiconductor device as an eighth embodiment of this invention. This semiconductor device is different from the semiconductor device shown in FIG. 13 in that a sealing film (insulating layer) 85 made of, for example, an epoxy resin is only provided on the upper surfaces of a semiconductor construct 6 and a lower insulating film 1. In this case, the seating film 85 is formed by a molding method such as a transfer molding method.

In addition, in the embodiments described above, the opening 5 of the connection pad portion 2a of the lower wiring line 2, the opening 17 formed in the lower insulating film 1 and the adhesive layer 7, etc. have a circular planar shape. However, the present invention is not limited to this. The planar shape of the opening can he any shape such as a polygonal shape. Moreover, the wiring line 14 connected to the connection pad 9 is formed in the semiconductor construct 6. However, the present invention is also applicable to a semiconductor construct which has no part for drawing the wiring lines but which only has external connection electrodes formed therein. Various other modifications can be made without departing from the spirit of the present invention.

Additional advantages and modifications will readily occur to those ski-led in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A semiconductor device comprising:
a semiconductor construct having a semiconductor substrate and an external connection electrode provided on the semiconductor substrate;

a wiring line having a connection pad portion in which a first opening is formed to correspond to the external connection electrode of the semiconductor construct;

an insulating film which is provided between the external connection electrode and the connection pad portion and which has a second opening communicating with the first opening and reaching the external connection electrode;

a connection conductor which electrically connects the external connection electrode to the wiring line via the first opening and the second opening; and a mask metal layer formed between the connection conductor and the wiring line.

2. The semiconductor device according to claim 1, wherein the mask metal layer has a planar size greater than that of the external connection electrode.

3. The semiconductor device according to claim 1, wherein the mask metal layer is formed of a material different from that of the wiring line.

4. The semiconductor device according to claim 1, wherein the wiring line is embedded in the lower side of the insulating film.

5. The semiconductor device according to claim 1, wherein a protective film is formed on the semiconductor substrate, and the external connection electrode is configured as part of a wiring line formed on the protective film.

6. The semiconductor device according to claim 1, wherein the semiconductor construct has an adhesive layer covering the upper surface of the external connection electrode.

7. The semiconductor device according to claim 1, wherein the adhesive layer has an opening constituting part of the second opening.

8. The semiconductor device according to claim 1, wherein a protective metal layer is located between the external connection electrode and the connection conductor and is in contact with the surface of the external connection electrode.

9. The semiconductor device according to claim 1, wherein the semiconductor construct has an antistatic protective film covering the upper surface of the external connection electrode.

10. The semiconductor device according to claim 1, wherein an upper insulating film is provided on the side of the semiconductor substrate of the semiconductor construct, and an upper wiring line is provided on the upper insulating film.

11. The semiconductor device according to claim 1, wherein an insulating layer is formed between the insulating film and the upper insulating film, and a circuit board connected to the wiring line is embedded in the insulating layer.

12. The semiconductor device according to claim 1, wherein a lower overcoat film covering the wiring line and the connection conductor is provided.

13. The semiconductor device according to claim 3, wherein the connection conductor has a metal layer of the same material as the mask metal layer at least on the mask metal layer.

14. The semiconductor device according to claim 6, wherein the insulating film includes a lower insulating film having a region corresponding to the adhesive layer and the semiconductor construct and a region corresponding to the periphery of the former region.

15. The semiconductor device according to claim 9, wherein the antistatic protective film has an opening communicating with the second opening.

16. The semiconductor device according to claim 10, wherein a vertical conducting portion is formed to penetrate the insulating film and the upper insulating film and thus connect the wiring line to the upper wiring line.

17. The semiconductor device according to claim 12, wherein an opening exposing a part of the wiring line of the lower overcoat film is provided, in the lower overcoat film and a solder bail is provided on the part of the wiring line exposed through the opening.

18. The semiconductor device according to claim 2, wherein the connection pad portion of the wiring line has the same planar size as the mask metal layer.

19. The semiconductor device according to claim 2, wherein the connection pad portion of the wiring line has a planar size smaller than that of the mask metal layer.

20. The semiconductor device according to claim 19, wherein the external connection electrode is a columnar electrode.

* * * * *